(12) United States Patent
Tang

(10) Patent No.: US 10,382,709 B2
(45) Date of Patent: *Aug. 13, 2019

(54) IMAGE PROCESSING METHOD AND APPARATUS, AND ELECTRONIC DEVICE

(71) Applicant: GUANGDONG OPPO MOBILE TELECOMMUNICATIONS CORP., LTD., Dongguan (CN)

(72) Inventor: Cheng Tang, Dongguan (CN)

(73) Assignee: GUANGDONG OPPO MOBILE TELECOMMUNICATIONS CORP., LTD., Dongguan, Guangdong (CN)

( * ) Notice: Subject to any disclaimer, the term of this patent is extended or adjusted under 35 U.S.C. 154(b) by 68 days.

This patent is subject to a terminal disclaimer.

(21) Appl. No.: 15/783,502

(22) Filed: Oct. 13, 2017

(65) Prior Publication Data

US 2018/0152647 A1 May 31, 2018

(30) Foreign Application Priority Data

Nov. 29, 2016 (CN) .......................... 2016 1 1079701

(51) Int. Cl.
*H04N 5/347* (2011.01)
*G06T 3/40* (2006.01)
(Continued)

(52) U.S. Cl.
CPC .......... *H04N 5/347* (2013.01); *G06T 3/4015* (2013.01); *G06T 5/001* (2013.01);
(Continued)

(58) Field of Classification Search
CPC .... H04N 5/347; H04N 9/04557; H04N 5/345; H04N 9/735; H04N 5/23293;
(Continued)

(56) References Cited

U.S. PATENT DOCUMENTS 5,011,261 A 4/1991 Gordon
6,999,119 B1 2/2006 Shibazaki et al.
(Continued)

FOREIGN PATENT DOCUMENTS

CN 1648934 A 8/2005
CN 1890688 A 1/2007
(Continued)

OTHER PUBLICATIONS

PCT/CN2017/085210 International Search Report and Written Opinion dated Jul. 28, 2017,12 pp.
(Continued)

*Primary Examiner* — Shahbaz Nazrul
(74) *Attorney, Agent, or Firm* — Lathrop Gage LLP

(57) ABSTRACT

An image processing method is provided. The image sensor is controlled to output a merged image and a color-block image of a same scene. The merged image is converted into a merged true-color image, and the color-block image is converted into a simulation true-color image. The merged true-color image and the simulation true-color image are displayed. At least one of the merged true-color image and the simulation true-color image is stored according to a user input. An image processing apparatus and an electronic device are also provided.

22 Claims, 16 Drawing Sheets

(51) Int. Cl.
*G06T 5/00* (2006.01)
*H04N 5/232* (2006.01)
*H04N 9/73* (2006.01)
*H01L 27/146* (2006.01)
*H04N 5/345* (2011.01)
*H04N 9/04* (2006.01)

(52) U.S. Cl.
CPC ... *H01L 27/14621* (2013.01); *H04N 5/23232* (2013.01); *H04N 5/23293* (2013.01); *H04N 5/345* (2013.01); *H04N 9/04557* (2018.08); *H04N 9/735* (2013.01)

(58) Field of Classification Search
CPC .......... H04N 5/23232; H01L 27/14621; G06T 5/001; G06T 3/4015
See application file for complete search history.

(56) References Cited

U.S. PATENT DOCUMENTS

| | | | |
|---|---|---|---|
| 8,345,144 | B1 | 1/2013 | Georgiev et al. |
| 8,810,697 | B2 | 8/2014 | Kawai |
| 8,817,141 | B2 | 8/2014 | Tanaka |
| 8,917,327 | B1 | 12/2014 | Bishay |
| 9,240,033 | B2 | 1/2016 | Li et al. |
| 9,979,942 | B2 | 5/2018 | Lim et al. |
| 9,998,690 | B2 | 6/2018 | Ajito |
| 10,110,809 | B2 | 10/2018 | Tang |
| 2003/0052981 | A1 | 3/2003 | Kakarala et al. |
| 2003/0086009 | A1 | 5/2003 | Yeh |
| 2004/0036795 | A1 | 2/2004 | Fujii |
| 2005/0068455 | A1 | 3/2005 | Hatano |
| 2006/0125947 | A1* | 6/2006 | Packer .............. H01L 27/14627 348/340 |
| 2007/0140578 | A1 | 6/2007 | Okutsu |
| 2007/0177236 | A1 | 8/2007 | Kijima et al. |
| 2007/0297649 | A1* | 12/2007 | Nakanishi .......... G06K 9/00664 382/118 |
| 2008/0062290 | A1 | 3/2008 | Lahav et al. |
| 2008/0089580 | A1 | 4/2008 | Marcu |
| 2008/0131028 | A1 | 6/2008 | Pillman et al. |
| 2008/0193049 | A1 | 8/2008 | Onomura |
| 2008/0316346 | A1 | 12/2008 | Watanabe |
| 2009/0167917 | A1 | 7/2009 | Miki et al. |
| 2009/0200451 | A1* | 8/2009 | Conners ................ H04N 5/2351 250/208.1 |
| 2009/0268043 | A1 | 10/2009 | Olsen et al. |
| 2010/0020210 | A1 | 1/2010 | Tsunekawa et al. |
| 2010/0157113 | A1 | 6/2010 | Kobayashi |
| 2010/0302384 | A1 | 12/2010 | Sawada |
| 2011/0234863 | A1 | 9/2011 | Ogasahara |
| 2011/0234865 | A1 | 9/2011 | Ogasahara |
| 2011/0273597 | A1* | 11/2011 | Ishiwata ........... H01L 27/14603 348/272 |
| 2012/0113290 | A1* | 5/2012 | Nakata ................ H04N 5/35554 348/222.1 |
| 2012/0127334 | A1 | 5/2012 | Imai |
| 2012/0230601 | A1 | 9/2012 | Iso et al. |
| 2012/0249819 | A1 | 10/2012 | Imai |
| 2012/0307098 | A1 | 12/2012 | Hasegawa |
| 2013/0083220 | A1 | 4/2013 | Imade |
| 2013/0315506 | A1 | 11/2013 | Mariya et al. |
| 2013/0322780 | A1 | 12/2013 | Huang |
| 2014/0078346 | A1 | 3/2014 | Imade |
| 2014/0153823 | A1 | 6/2014 | Lee et al. |
| 2014/0176780 | A1* | 6/2014 | Koshiba .................. G02B 7/34 348/336 |
| 2014/0192250 | A1 | 7/2014 | Mitsunaga |
| 2014/0267828 | A1* | 9/2014 | Kasai .................. H04N 9/045 348/229.1 |
| 2014/0270518 | A1 | 9/2014 | Yano |
| 2014/0340565 | A1 | 11/2014 | Kitani et al. |
| 2015/0010242 | A1 | 1/2015 | Baillo et al. |
| 2015/0029358 | A1 | 1/2015 | Kaizu |
| 2015/0062422 | A1* | 3/2015 | Stern .................... H04N 5/2254 348/374 |
| 2015/0093039 | A1 | 4/2015 | Li et al. |
| 2015/0172615 | A1 | 6/2015 | Tanaka |
| 2015/0189200 | A1* | 7/2015 | Jin ........................ H04N 9/045 348/46 |
| 2015/0312537 | A1 | 10/2015 | Solhusvik et al. |
| 2015/0317776 | A1 | 11/2015 | Sugimoto et al. |
| 2015/0326842 | A1 | 11/2015 | Huai |
| 2015/0350583 | A1 | 12/2015 | Mauritzson et al. |
| 2016/0014354 | A1 | 1/2016 | Fukuda |
| 2016/0028966 | A1 | 1/2016 | Sheikh et al. |
| 2016/0050354 | A1 | 2/2016 | Musatenko et al. |
| 2016/0073077 | A1 | 3/2016 | Kurahashi |
| 2016/0080627 | A1* | 3/2016 | Matsuoka ............ H04N 5/2355 348/222.1 |
| 2016/0080653 | A1* | 3/2016 | Kim ........................ G06T 5/002 348/216.1 |
| 2016/0247262 | A1 | 8/2016 | Li et al. |
| 2016/0316158 | A1 | 10/2016 | Uchida |
| 2016/0323518 | A1 | 11/2016 | Rivard et al. |
| 2016/0373649 | A1 | 12/2016 | Honda et al. |
| 2017/0064202 | A1 | 3/2017 | Ajito |
| 2017/0163875 | A1* | 6/2017 | Takao .................. H04N 5/3572 |
| 2017/0180681 | A1 | 6/2017 | Okita |
| 2017/0213319 | A1 | 7/2017 | Kurihara et al. |
| 2017/0223250 | A1 | 8/2017 | Ajito |
| 2017/0251188 | A1 | 8/2017 | Kaizu |
| 2017/0295332 | A1 | 10/2017 | Tang |
| 2018/0077392 | A1 | 3/2018 | Fukutomi et al. |
| 2018/0150932 | A1 | 5/2018 | Tang |
| 2018/0152631 | A1 | 5/2018 | Wei |
| 2018/0152632 | A1 | 5/2018 | Tang |
| 2018/0152685 | A1 | 5/2018 | Wei |
| 2018/0225810 | A1 | 8/2018 | Kajimura |
| 2018/0241940 | A1 | 8/2018 | Wei |

FOREIGN PATENT DOCUMENTS

| | | | |
|---|---|---|---|
| CN | 101616259 | A | 12/2009 |
| CN | 102970482 | A | 3/2013 |
| CN | 103531603 | A | 1/2014 |
| CN | 103765876 | A | 4/2014 |
| CN | 103856617 | A | 6/2014 |
| CN | 104580910 | A | 4/2015 |
| CN | 104881853 | A | 9/2015 |
| CN | 105430359 | A | 3/2016 |
| CN | 105430361 | A | 3/2016 |
| CN | 105430362 | A | 3/2016 |
| CN | 105516697 | A | 4/2016 |
| CN | 105578006 | A | 5/2016 |
| CN | 105578067 | A | 5/2016 |
| CN | 105578072 | A | 5/2016 |
| CN | 105578078 | A | 5/2016 |
| CN | 105578079 | A | 5/2016 |
| CN | 105592270 | A | 5/2016 |
| CN | 105592303 | A | 5/2016 |
| CN | 105611185 | A | 5/2016 |
| CN | 105611258 | A | 5/2016 |
| CN | 105765962 | A | 7/2016 |
| CN | 105825479 | A | 8/2016 |
| CN | 106341670 | A | 1/2017 |
| CN | 106454054 | A | 2/2017 |
| CN | 106454288 | A | 2/2017 |
| CN | 106454289 | A | 2/2017 |
| CN | 106504218 | A | 3/2017 |
| CN | 106507018 | A | 3/2017 |
| CN | 106507067 | A | 3/2017 |
| CN | 106534822 | A | 3/2017 |
| EP | 2753082 | A1 | 7/2014 |
| EP | 3229467 | A1 | 10/2017 |
| JP | 2009025381 | A | 2/2009 |

OTHER PUBLICATIONS

European Patent Application No. 17199868.5 extended Search and Opinion dated Mar. 26, 2018, 8 pages.

(56) References Cited

OTHER PUBLICATIONS

Chinese Patent Application No. 201611079604.5 First Office Action dated May 31, 2017, 5 pages.
Chinese Patent Application No. 201611079604.5 English translation of First Office Action dated May 31, 2017, 4 pages.
Chinese Patent Application No. 201611079604.5 Second Office Action dated Jun. 26, 2017, 3 pages.
Chinese Patent Application No. 201611079604.5 English translation of Second Office Action dated Jun. 26 , 2017, 4 pages.
Chinese Patent Application No. 201611079604.5 Notification to Grant Patent Right for Invention dated Aug. 23, 2017, 3 pages.
Chinese Patent Application No. 201611079604.5 English translation of Notification to Grant Patent Right for Invention dated Aug. 23, 2017, 2 pages.
Chinese Patent Application No. 201611079604.5 English translation of Allowed Claims as of Aug. 23, 2017, 6 pages.
European Patent Application No. 17202517.3 extended Search and Opinion dated Apr. 26, 2018, 8 pages.
Chinese Patent Application No. 201611079892.4, First Office Action dated Oct. 31, 2017, 7 pages.
Chinese Patent Application No. 201611079892.4, English translation of First Office Action dated Oct. 31, 2017, 8 pages.
Chinese Patent Application No. 201611079892.4, Notification to Grant Patent Right for Invention dated Dec. 28, 2017, 3 pages.
Chinese Patent Application No. 201611079892.4, English translation of Notification to Grant Patent Right for Invention dated Dec. 28, 2017, 2 pages.
Chinese Patent Application No. 201611079892.4, English translation of Allowed Claims as of Dec. 28, 2017, 7 pages.
European Patent Application No. 17198507.0 extended Search and Opinion dated Apr. 19, 2018, 20 pages.
Battiato S., et al: "Bayer image enlargement using correlated color components", 2002 Digest of Technical Papers / ICCE, International Conference on Consumer Electronics, Twenty-First in the Series, Jun. 18-20, 2002, IEEE, Jun. 18, 2002 (Jun. 18, 2002), pp. 230-231, cited in office action from EPO for EP Application No. 17198507.0.
PCT/CN2017/081921 International Search Report and Written Opinion dated Aug. 23, 2017, 12 pages.
U.S. Appl. No. 15/962,466 Office Action dated Jul. 19, 2018, 44 pages.
U.S. Appl. No. 15/727,761 Office Action dated Dec. 10, 2018, 27 pages.
U.S. Appl. No. 15/789,642 Office Action dated Dec. 3, 2018, 25 pages.
PCT/CN2017/085211 International Search Report & Written Opinion dated Jul. 26, 2017, 12 pages.
European Patent Application No. 17199021.1 Extended Search and Opinion dated Apr. 19, 2018, 16 pages.
Chinese Patent Application No. 201611092363.8, Office Action dated Aug. 28, 2018, 6 pp.
Chinese Patent Application No. 201611092363.8, English translation of Office Action dated Aug. 28, 2018, 7 pages.
European Patent Application No. 17198456.0 Extended Search and Opinion dated Mar. 26, 2018, 9 pages.
PCT/CN2017085209 International Search Report and Written Opinion dated Aug. 17, 2017, 12 pages.
Chinese Patent Application No. 201611079701.4 English translation of Office Action dated Dec. 4, 2018, 8 pages.
Chinese Patent Application No. 201611079701.4 Office Action dated Dec. 4, 2018, 6 pages.

* cited by examiner

Merged image

| R | R | Gr | Gr |
|---|---|----|----|
| R | R | Gr | Gr |
| Gb | Gb | B | B |
| Gb | Gb | B | B | color-block image

Fig. 7

IMAGE PROCESSING METHOD AND APPARATUS, AND ELECTRONIC DEVICE

CROSS-REFERENCE TO RELATED APPLICATIONS

This application is based on and claims priority of Chinese Patent Application No. 201611079701.4, filed on Nov. 29, 2016, the entire contents of which are incorporated herein by reference.

FIELD

The present disclosure relates to the imaging technology field, and more particularly to an image processing method, an image processing apparatus and an electronic device.

BACKGROUND

When an image is processed using a conventional image processing method, either the obtained image has a low quality or resolution, or it takes too much resource to store all the obtained images, both of which are inconvenient for users.

DISCLOSURE

The present disclosure aims to solve at least one of existing problems in the related art to at least extent. Accordingly, the present disclosure provides an image processing method, an image processing apparatus and an electronic device.

Embodiments of the present disclosure provide an image processing method. The image processing method is applied in an electronic device. The electronic device includes a display and an imaging apparatus including an image sensor. The image sensor includes an array of photosensitive pixel units and an array of filter units arranged on the array of photosensitive pixel units, each filter unit corresponds to one photosensitive pixel unit, and each photosensitive pixel unit includes a plurality of photosensitive pixels. The image processing method includes: controlling an image sensor to output a merged image and a color-block image of a same scene, in which the merged image includes an array of merged pixels, and the photosensitive pixels in a same photosensitive pixel unit are collectively output as one merged pixel, the color-block image includes image pixel units arranged in a preset array, each image pixel unit includes a plurality of original pixels, each photosensitive pixel unit corresponds to one image pixel unit, and each photosensitive pixel corresponds to one original pixel; converting the merged image into a merged true-color image, and converting the color-block image into a simulation true-color image; displaying the merged true-color image and the simulation true-color image; and storing at least one of the merged true-color image and the simulation true-color image according to a user input.

Embodiments of the present disclosure further provide an image processing apparatus. The image processing apparatus is applied in an electronic device. The electronic device includes an a display and an imaging apparatus including an image sensor. The image sensor includes an array of photosensitive pixel units and an array of filter units arranged on the array of photosensitive pixel units. Each filter unit corresponds to one photosensitive pixel unit, and each photosensitive pixel unit includes a plurality of photosensitive pixels. The image processing apparatus includes a non-transitory computer-readable medium including computer-readable instructions stored thereon, and an instruction execution system which is configured by the instructions to implement at least one of a control module, a first converting module, a second converting module, a displaying module, and a storing module. The control module is configured to control the image sensor to output a merged image and a color-block image of a same scene. The merged image includes an array of merged pixels, and the photosensitive pixels in a same photosensitive pixel unit are collectively output as one merged pixel. The color-block image includes image pixel units arranged in a preset array. Each image pixel unit includes a plurality of original pixels. Each photosensitive pixel unit corresponds to one image pixel unit, and each photosensitive pixel corresponds to one original pixel. The first converting module is configured to convert the merged image into a merged true-color image. The second converting module is configured to convert the color-block image into a simulation true-color image. The displaying module is configured to display the merged true-color image and the simulation true-color image. The storing module is configured to store at least one of the merged true-color image and the simulation true-color image according to a user input.

Embodiments of the present disclosure provide an electronic device. The electronic device includes a housing, a processor, a memory, a circuit board, a power supply circuit, an input component, a display and an imaging apparatus. The circuit board is enclosed by the housing. The processor and the memory are positioned on the circuit board. The power supply circuit is configured to provide power for respective circuits or components of the electronic device. The imaging apparatus includes an image sensor. The image sensor includes an array of photosensitive pixel units and an array of filter units arranged on the array of photosensitive pixel units. Each filter unit corresponds to one photosensitive pixel unit, and each photosensitive pixel unit includes a plurality of photosensitive pixels. The input component is configured to receive a user input. The display is configured to display images. The memory is configured to store executable program codes. The processor is configured to run a program corresponding to the executable program codes by reading the executable program codes stored in the memory, to perform the image processing method according to embodiments of the present disclosure.

Additional aspects and advantages of embodiments of present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of embodiments of the present disclosure will become apparent and more readily appreciated from the following descriptions made with reference to the drawings.

FIG. 7 is a schematic diagram of a color-block image according to an embodiment of the present disclosure.

EMBODIMENTS OF THE PRESENT DISCLOSURE

Reference will now be made in detail to exemplary embodiments, examples of which are illustrated in the accompanying drawings, in which the same or similar reference numbers throughout the drawings represent the same or similar elements or elements having same or similar functions. Embodiments described below with reference to drawings are merely exemplary and used for explaining the present disclosure, and should not be understood as limitation to the present disclosure.

In the related art, an image sensor includes an array of photosensitive pixel units and an array of filter units arranged on the array of photosensitive pixel unit. Each filter unit corresponds to and covers one photosensitive pixel unit, and each photosensitive pixel unit includes a plurality of photosensitive pixels. When working, the image sensor is controlled to output a merged image, which can be converted into a merged true-color image by an image processing method and saved. The merged image includes an array of merged pixels, and the photosensitive pixels in a same photosensitive pixel unit are collectively outputted as one merged pixel. Thus, a signal-to-noise ratio of the merge image is increased. However, a resolution of the merged image is reduced.

Certainly, the image sensor can be controlled to output a high pixel color-block image, which includes an array of original pixels, and each photosensitive pixel corresponds to one original pixel. However, since a plurality of original pixels corresponding to a same filter unit have the same color, the resolution of the color-block image still cannot be increased. Thus, the high pixel color-block image needs to be converted into a high pixel simulation image by an interpolation algorithm, in which the simulation image includes a Bayer array of simulation pixels. Then, the simulation image can be converted into a simulation true-color image by an image processing method and saved. In actual application, since the merged true-color image and the simulation true-color image have their own advantages respectively, an image having a low quality may be selected when one image of them is randomly or fixedly saved, while it may cause a waste of hardware when both of them are saved.

Thus, embodiments of the present disclosure provide a novel image processing method.

Figure 1:
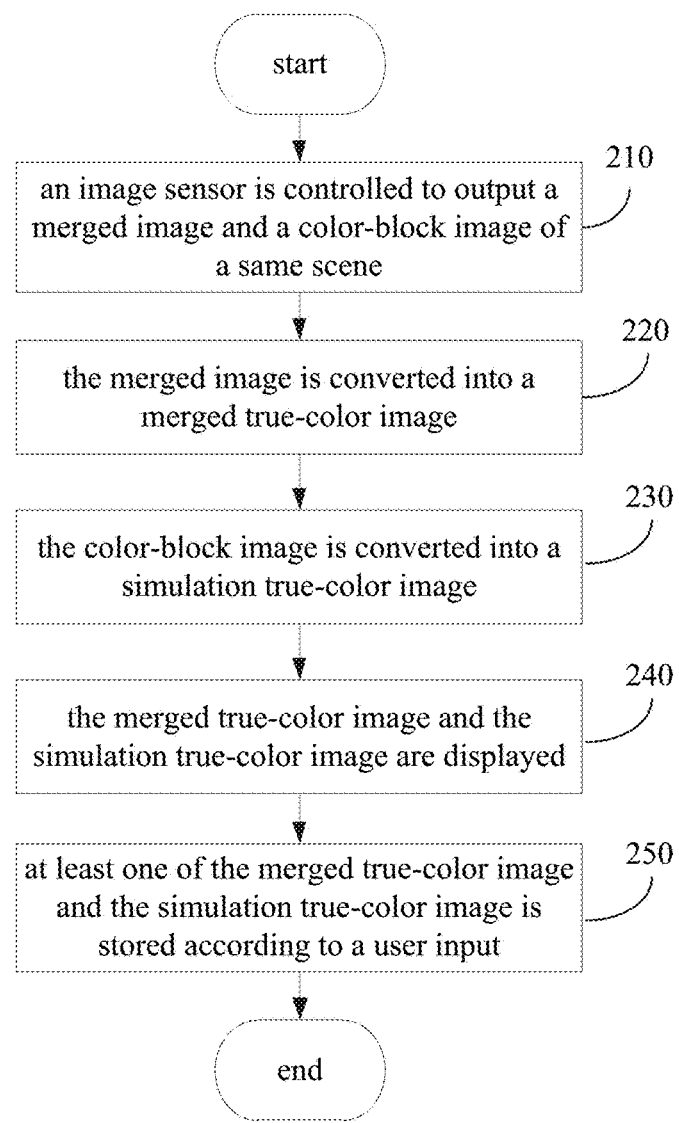
FIG. 1 is a flow chart of an image processing method according to an embodiment of the present disclosure.
Figure 2:
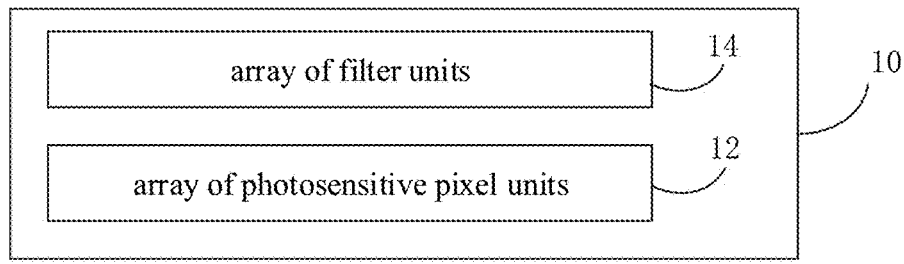
FIG. 2 is a block diagram of an image sensor according to an embodiment of the present disclosure.
Figure 3:
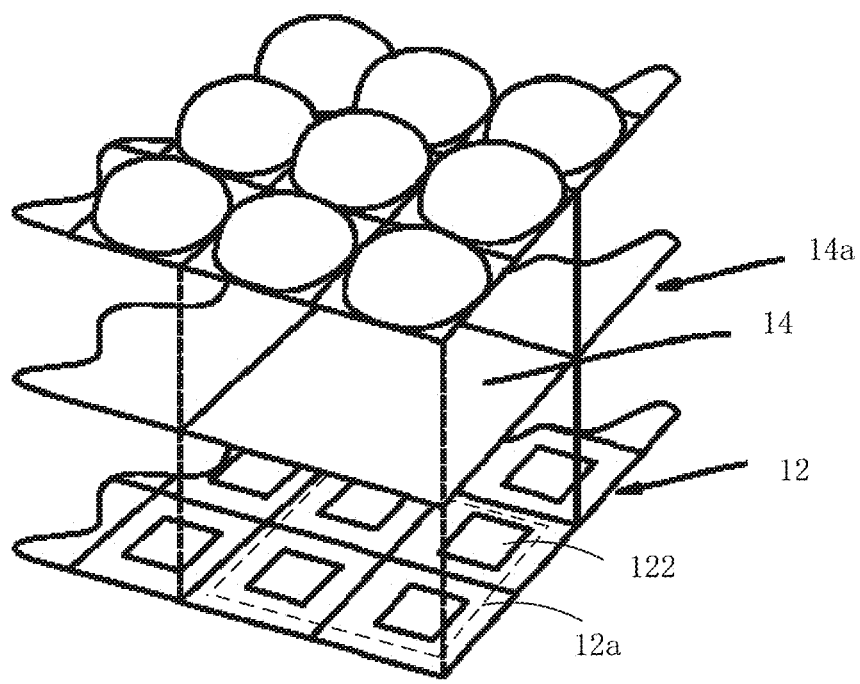
FIG. 3 is a schematic diagram of an image sensor according to an embodiment of the present disclosure.

Referring to FIG. 1, an image processing method is illustrated. The image processing method is applied in an electronic device. The electronic device includes a display and an imaging apparatus including an image sensor. As illustrated in FIGS. 2 and 3, the image sensor 10 includes an array 12 of photosensitive pixel units and an array 14 of filter units arranged on the array 12 of photosensitive pixel units. Each filter unit 14a corresponds to one photosensitive pixel unit 12a, and each photosensitive pixel unit 12a includes a plurality of photosensitive pixels 122. The image processing method includes the followings.

At block 210, an image sensor is controlled to output a merged image and a color-block image of a same scene.

The merged image includes an array of merged pixels. The photosensitive pixels in a same photosensitive pixel unit are collectively output as one merged pixel. The color-block image includes image pixel units arranged in a preset array. Each image pixel unit includes a plurality of original pixels. Each photosensitive pixel unit corresponds to one image pixel unit. Each photosensitive pixel corresponds to one original pixel.

At block 220, the merged image is converted into a merged true-color image.

At block 230, the color-block image is converted into a simulation true-color image.

At block 240, the merged true-color image and the simulation true-color image are displayed.

At block 250, at least one of the merged true-color image and the simulation true-color image is stored according to a user input.

With the image processing method according to embodiments of the present disclosure, at least one of the merged true-color image and the simulation true-color image is stored according to the user input, thus avoiding the blindness caused by randomly or fixedly saving one of the two kinds of images or avoiding the loss of resources caused by saving both of the two kinds of images, and improving users' satisfaction.

In some implementations, the display of the electronic device may be controlled to simultaneously display the merged true-color image and the simulation true-color image side-by-side. The user can zoom in the two images displayed side-by-side to view details and compare the two images with each other, so as to select an appropriate image.

In some implementations, the display of the electronic device may be controlled to first display one of the merged true-color image and the simulation true-color image, and then the user selects to display the other one of the merged true-color image and the simulation true-color image, which is not limited herein.

Figure 4:
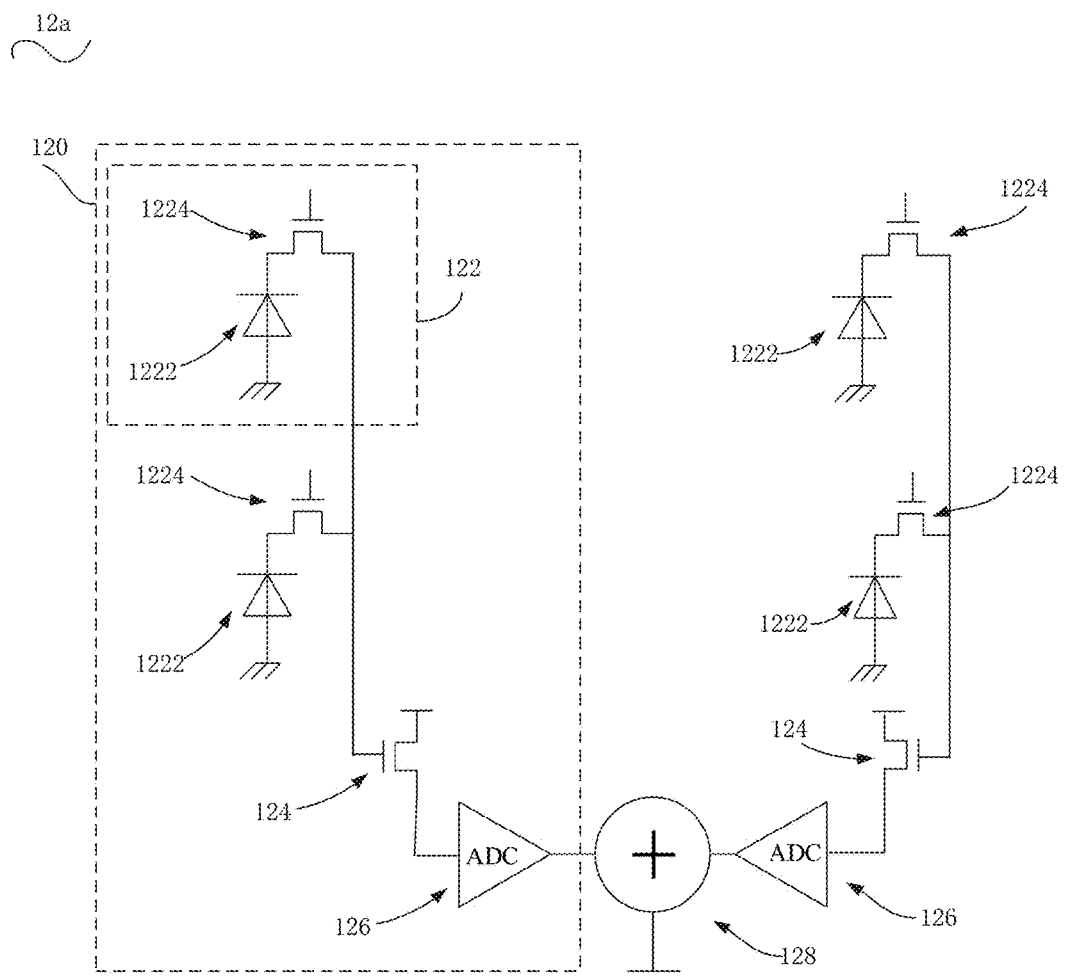
FIG. 4 is a schematic diagram illustrating a circuit of an image sensor according to an embodiment of the present disclosure.
Figure 5:
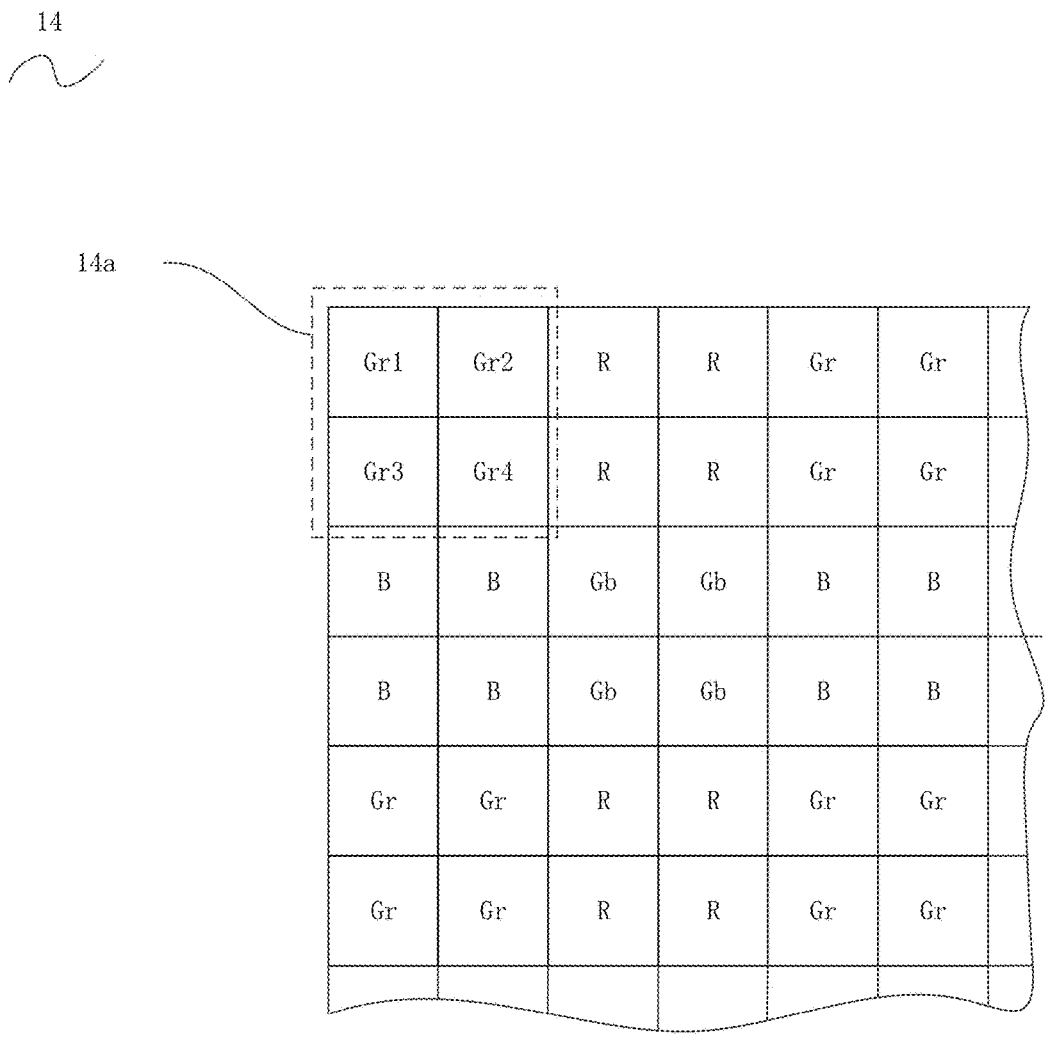
FIG. 5 is a schematic diagram of an array of filter units according to an embodiment of the present disclosure.
Figure 6:
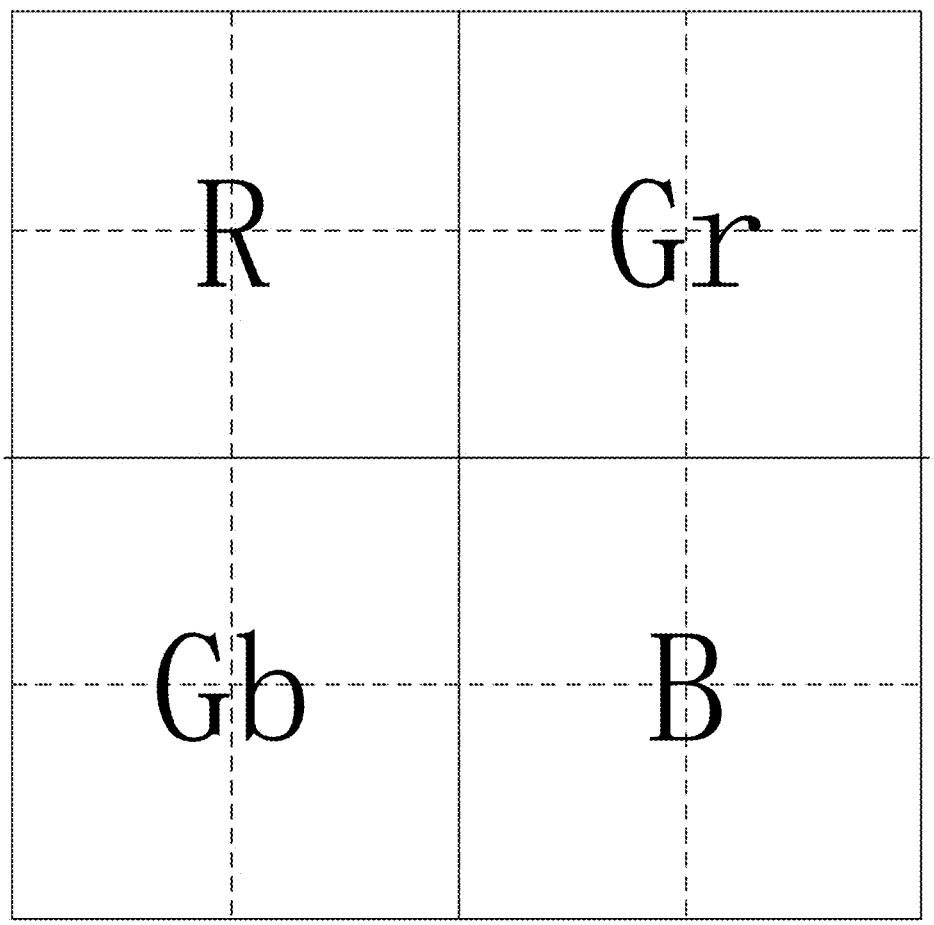
FIG. 6 is a schematic diagram of a merged image according to an embodiment of the present disclosure.

FIG. 4 is a schematic diagram illustrating a circuit of an image sensor according to an embodiment of the present disclosure. FIG. 5 is a schematic diagram of an array of filter units according to an embodiment of the present disclosure. FIGS. 2-5 are better viewed together.

Referring to FIGS. 2-5, the image sensor 10 according to an embodiment of the present disclosure includes an array 12 of photosensitive pixel units and an array 14 of filter units arranged on the array 12 of photosensitive pixel units.

Further, the array 12 of photosensitive pixel units includes a plurality of photosensitive pixel units 12a. Each photosensitive pixel unit 12a includes a plurality of adjacent photosensitive pixels 122. Each photosensitive pixel 122 includes a photosensitive element 1222 and a transmission tube 1224. The photosensitive element 1222 may be a photodiode, and the transmission tube 1224 may be a MOS transistor.

The array 14 of filter units includes a plurality of filter units 14a. Each filter unit 14a corresponds to one photosensitive pixel unit 12a.

In detail, in some examples, the filter units are arranged in a Bayer array. In other words, four adjacent filter units 14a include one red filter unit, one blue filter unit and two green filter units.

Each photosensitive pixel unit 12a corresponds to a filter unit 14a with a same color. If a photosensitive pixel unit 12a includes n adjacent photosensitive elements 1222, one filter unit 14a covers n photosensitive elements 1222 in one photosensitive pixel unit 12a. The filter unit 14a may be formed integrally, or may be formed by assembling n separate sub filters.

In some implementations, each photosensitive pixel unit 12a includes four adjacent photosensitive pixels 122. Two adjacent photosensitive pixels 122 collectively form one photosensitive pixel subunit 120. The photosensitive pixel subunit 120 further includes a source follower 124 and an analog-to-digital converter 126. The photosensitive pixel unit 12a further includes an adder 128. A first electrode of each transmission tube 1224 in the photosensitive pixel subunit 120 is coupled to a cathode electrode of a corresponding photosensitive element 1222. Second electrodes of all the transmission tubes 1224 are collectively coupled to a gate electrode of the source follower 124 and coupled to an analog-to-digital converter 126 via the source electrode of the source follower 124. The source follower 124 may be a MOS transistor. Two photosensitive pixel subunits 120 are coupled to the adder 128 via respective source followers 124 and respective analog-to-digital converters 126.

In other words, four adjacent photosensitive elements 1222 in one photosensitive pixel unit 12a of the image sensor 10 according to an embodiment of the present disclosure collectively use one filter unit 14a with a same color as the photosensitive pixel unit. Each photosensitive element 1222 is coupled to a transmission tube 1224 correspondingly. Two adjacent photosensitive elements 1222 collectively use one source follower 124 and one analog-digital converter 126. Four adjacent photosensitive elements 1222 collectively use one adder 128.

Further, four adjacent photosensitive elements 1222 are arranged in a 2-by-2 array. Two photosensitive elements 1222 in one photosensitive pixel subunit 120 can be in a same row.

During an imaging process, when two photosensitive pixel subunits 120 or four photosensitive elements 1222 covered by a same filter unit 14a are exposed simultaneously, pixels can be merged, and the merged image can be outputted.

In detail, the photosensitive element 1222 is configured to convert light into charges, and the amount of charges is proportional to an illumination intensity. The transmission tube 1224 is configured to control a circuit to turn on or off according to a control signal. When the circuit is turned on, the source follower 124 is configured to convert the charge generated through light illumination into a voltage signal. The analog-to-digital converter 126 is configured to convert the voltage signal into a digital signal. The adder 128 is configured to add and output two digital signals.

Figure 8:
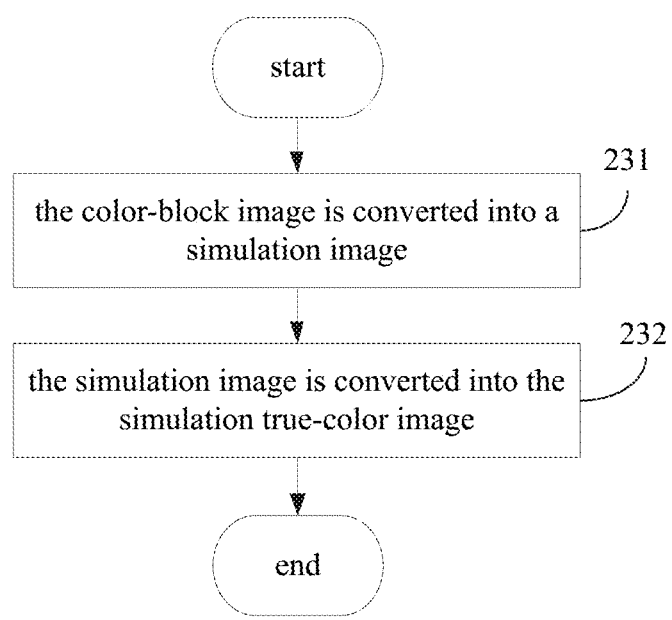
FIG. 8 is a flow chart illustrating a process of converting the color-block image into a simulation true-color image according to an embodiment of the present disclosure.

Referring to FIG. 8, take an image sensor 10 of 16M as an example. The image sensor 10 according to an embodiment of the present disclosure can merge photosensitive pixels 122 of 16M into photosensitive pixels of 4M, i.e., the image sensor 10 outputs the merged image. After the merging, the photosensitive pixel 122 quadruples in size, such that the photosensibility of the photosensitive pixel 122 is increased. In addition, since most part of noise in the image sensor 10 is random, there may be noise points at one or two pixels. After four photosensitive pixels 122 are merged into a big photosensitive pixel 122, an effect of noise points on the big photosensitive pixel is reduced, i.e., the noise is weakened and SNR (signal to noise ratio) is improved.

However, when the size of the photosensitive pixel 122 is increased, the number of pixels is decreased, and thus the resolution of the merged image is decreased.

During an imaging process, when four photosensitive elements 1222 covered by a same filter unit 14a are exposed in sequence, a color-block image is output.

In detail, the photosensitive element 1222 is configured to convert light into charges, and the amount of charges is proportional to an illumination intensity. The transmission tube 1224 is configured to control a circuit to turn on or off according to a control signal. When the circuit is turned on, the source follower 124 is configured to convert the charge generated through light illumination into a voltage signal. The analog-to-digital converter 126 is configured to convert the voltage signal into a digital signal.

Referring to FIG. 7, take an image sensor 10 of 16M as an example. The image sensor according to an embodiment of the present disclosure can output photosensitive pixels 122 of 16M, i.e., the image sensor 10 outputs the color-block image. The color-block image includes image pixel units. The image pixel unit includes original pixels arranged in a 2-by-2 array. The size of the original pixel is the same as that of the photosensitive pixel 122. However, since filter unit 14a covering four adjacent photosensitive elements 1222 has a same color (i.e., although four photosensitive elements 1222 are exposed respectively, the filter unit 14a covers the four photosensitive elements has a same color), four adjacent original pixels in each image pixel unit of the output image have a same color, and thus the resolution of the image cannot be increased.

The image processing method according to an embodiment of the present disclosure is able to process the output color-block image to obtain a simulation image.

In some embodiments, when a merged image is output, four adjacent photosensitive pixels 122 with the same color can be output as one merged pixel. Accordingly, four adjacent photosensitive pixels in the merged image can be considered as being arranged in a typical Bayer array, and can be processed directly to output a merged true-color image. When a color-block image is output, each photosensitive pixel 122 is output separately. Since four adjacent photosensitive pixels 122 have a same color, four adjacent original pixels in an image pixel unit have a same color, which form an untypical Bayer array. However, the untypical Bayer array cannot be directly processed. In other words, when the image sensor 10 adopts a same apparatus for processing the image, in order to realize a compatibility of the true-color image outputs under two modes (i.e., the merged true-color image under a merged mode and the simulation true-color image under a color-block mode), it is required to convert the color-block image into the simulation image, or to convert the image pixel unit in an untypical Bayer array into pixels arranged in the typical Bayer array.

The simulation image includes simulation pixels arranged in the Bayer array. Each photosensitive pixel corresponds to one simulation pixel. One simulation pixel in the simulation image corresponds to an original pixel located at the same position as the simulation pixel and in the color-block image.

Referring to FIG. 8, in some implementations, the act at block 230 includes the followings.

At block 231, the color-block image is converted into a simulation image.

The simulation image includes simulation pixels arranged in the preset array. Each photosensitive pixel corresponds to one simulation pixel.

At block 232, the simulation image is converted into the simulation true-color image.

Figure 9:
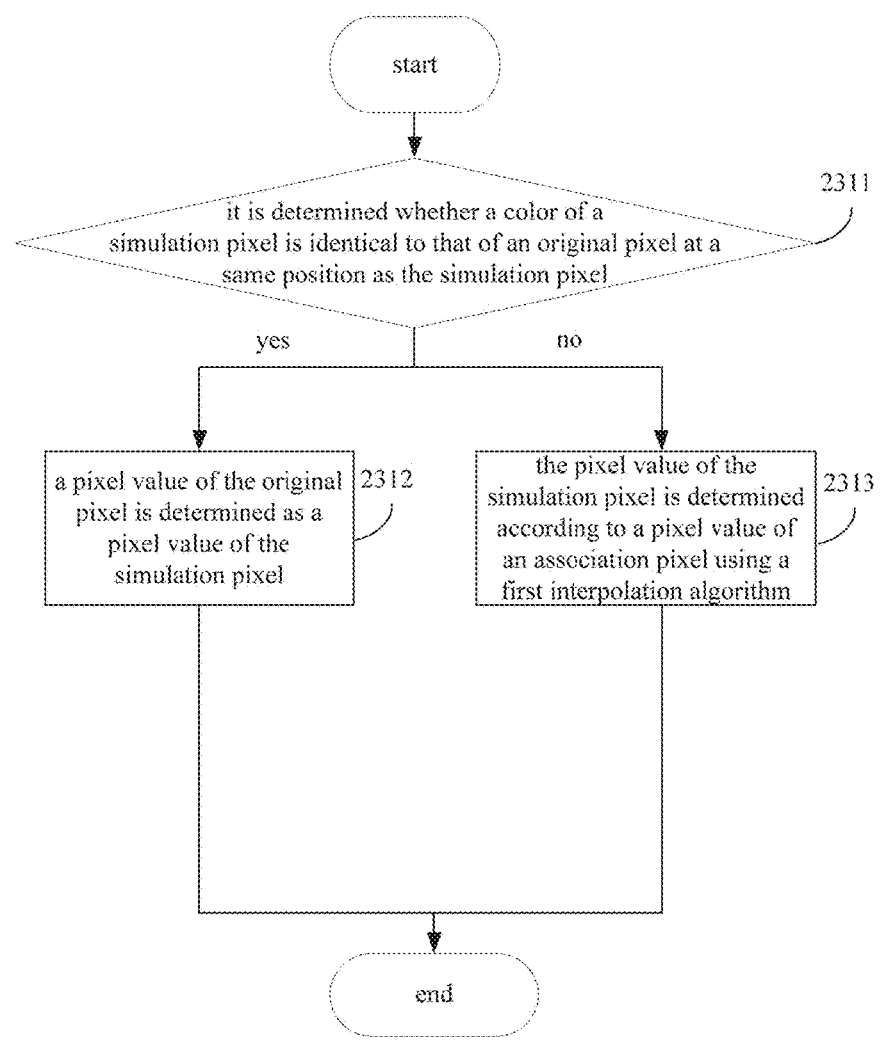
FIG. 9 is a flow chart illustrating a process of converting the color-block image into a simulation image according to an embodiment of the present disclosure.

Referring to FIG. 9, in some implementations, the act at block 231 includes the followings.

At block 2311, it is determined whether a color of a simulation pixel is identical to that of an original pixel at a same position as the simulation pixel.

At block 2312, when the color of the simulation pixel is identical to that of the original pixel at the same position as the simulation pixel, a pixel value of the original pixel is determined as a pixel value of the simulation pixel.

At block 2313, when the color of the simulation pixel is different from that of the original pixel at the same position as the simulation pixel, the pixel value of the simulation pixel is determined according to a pixel value of an association pixel using a first interpolation algorithm.

The association pixel is selected from an image pixel unit with a same color as the simulation pixel and adjacent to an image pixel unit including the original pixel.

Figure 10:
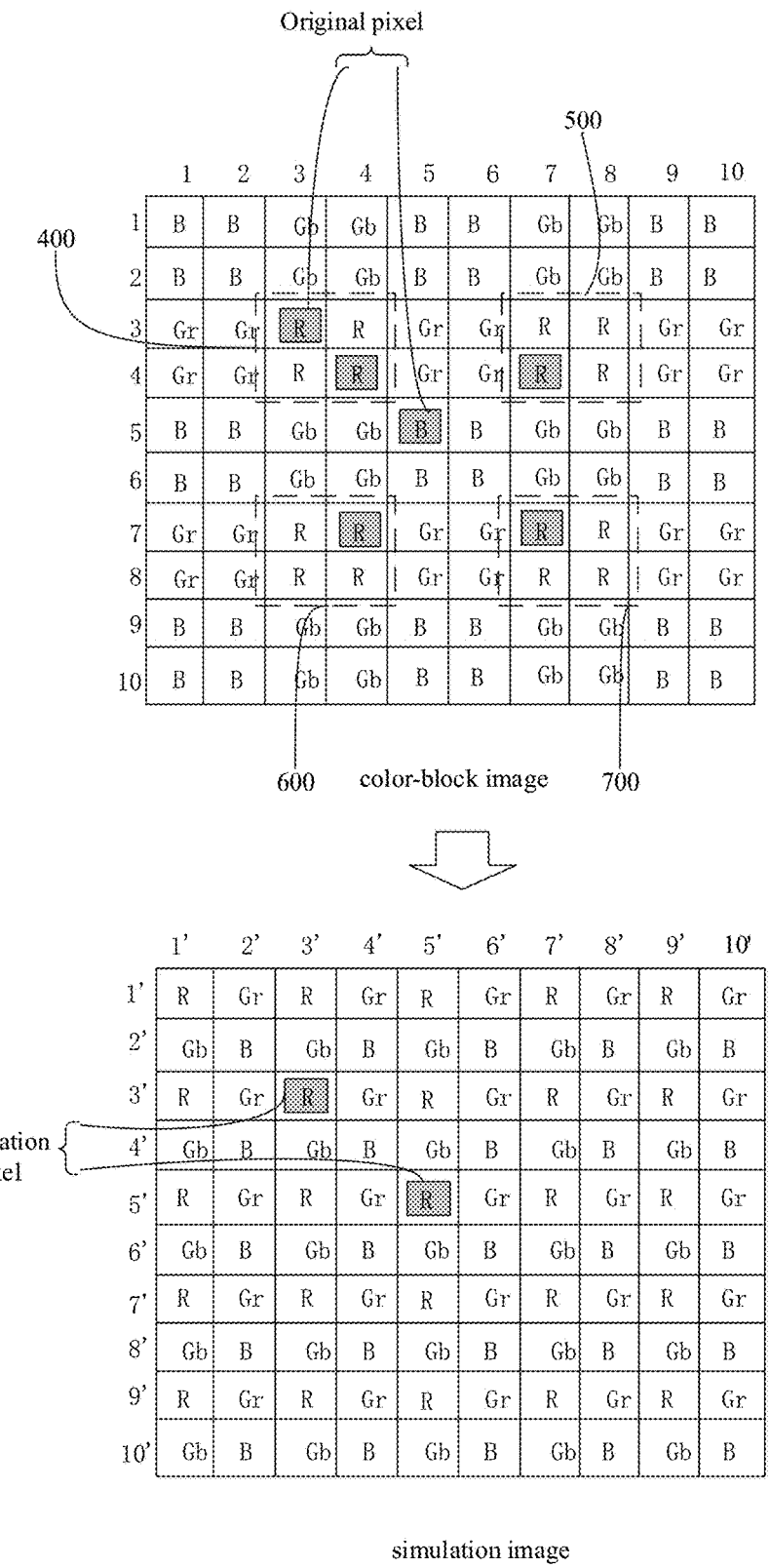
FIG. 10 is a schematic diagram illustrating a process of converting a color-block image into a simulation image according to an embodiment of the present disclosure.

Referring to FIG. 10, for the simulation pixels R3'3' and R5'5', the corresponding original pixels are R33 and B55.

When the simulation pixel R3'3' is obtained, since the simulation pixel R3'3' has the same color as the corresponding original pixel R33, the pixel value of the original pixel R33 is directly determined as the pixel value of the simulation pixel R3'3' during conversion.

When the simulation pixel R5'5' is obtained, since the simulation pixel R5'5' has a color different from that of the corresponding original pixel B55, the pixel value of the original pixel B55 cannot be directly determined as the pixel value of the simulation pixel R5'5', and it is required to calculate the pixel value of the simulation pixel R5'5' according to an association pixel of the simulation pixel R5'5' by an interpolation algorithm.

It should be noted that, a pixel value of a pixel mentioned in the context should be understood in a broad sense as a color attribute value of the pixel, such as a color value.

There may be more than one association pixel unit for each simulation pixel, for example, there may be four association pixel units, in which the association pixel units have the same color as the simulation pixel and are adjacent to the image pixel unit including the original pixel at the same position as the simulation pixel.

It should be noted that, "adjacent" here should be understood in a broad sense. Take FIG. 10 as an example, the simulation pixel R5'5' corresponds to the original pixel B55. The image pixel units 400, 500, 600 and 700 are selected as the association pixel units, but other red image pixel units far away from the image pixel unit where the original pixel B55 is located are not selected as the association pixel units. In each association pixel unit, the red original pixel closest to the original pixel B55 is selected as the association pixel, which means that the association pixels of the simulation pixel R5'5' include the original pixels R44, R74, R47 and R77. The simulation pixel R5'5' is adjacent to and has the same color as the original pixels R44, R74, R47 and R77.

In different cases, the original pixels can be converted into the simulation pixels in different ways, thus converting the color-block image into the simulation image. Since the filters in the Bayer array are adopted when shooting the image, the SNR of the image is improved. During the image processing procedure, the interpolation processing is performed on the color-block image by the interpolation algorithm, such that the distinguishability and resolution of the image can be improved.

Figure 11:
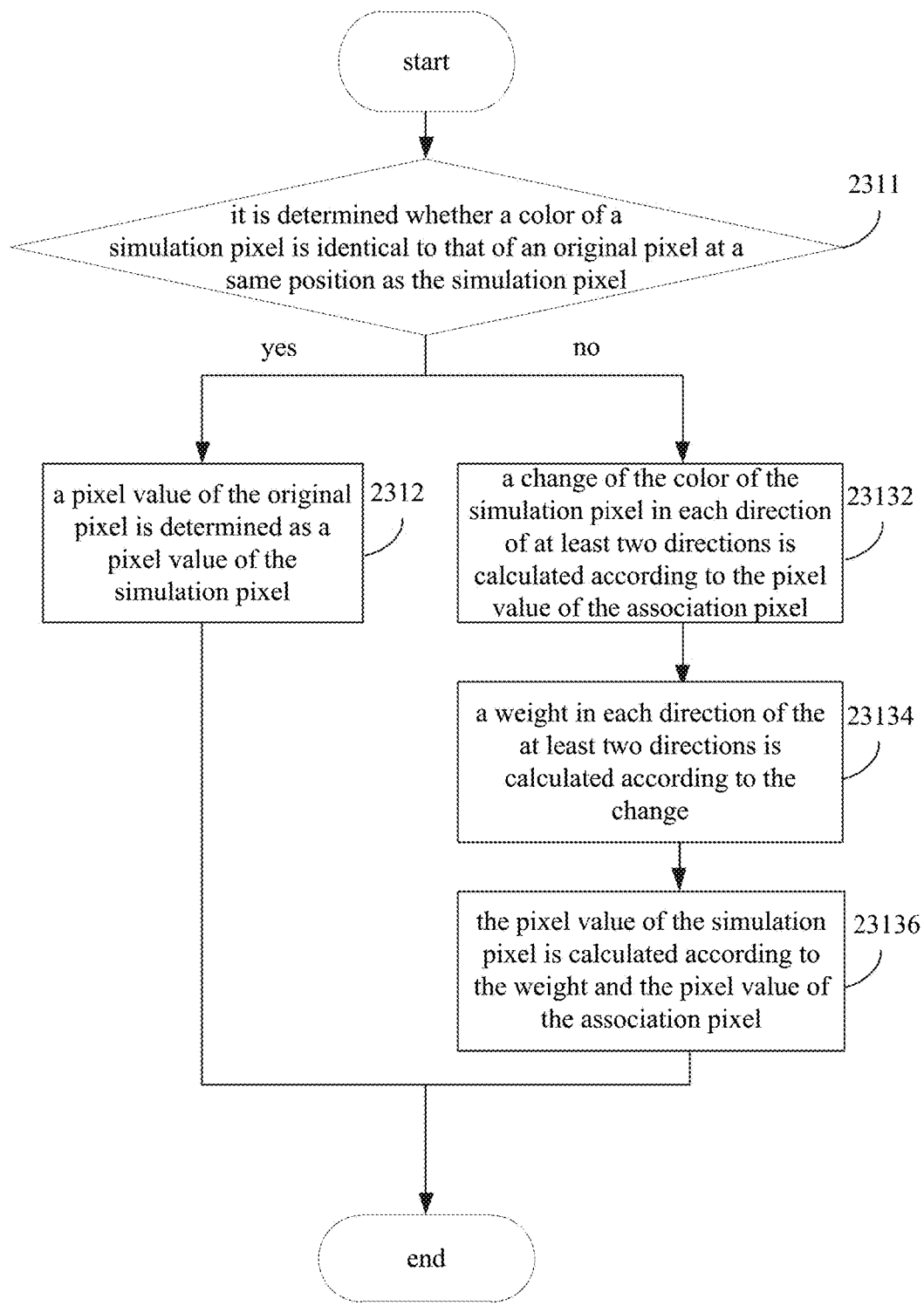
FIG. 11 is a flow chart illustrating a process of determining the pixel value of the simulation pixel according to the pixel value of the association pixel according to an embodiment of the present disclosure.

Referring to FIG. 11, in some implementations, the act at block 2313 (i.e., determining the pixel value of the simulation pixel according to the pixel value of the association pixel) includes the followings.

At block 23132, a change of the color of the simulation pixel in each direction of at least two directions is calculated according to the pixel value of the association pixel.

At block 23134, a weight in each direction of the at least two directions is calculated according to the change.

At block 23136, the pixel value of the simulation pixel is calculated according to the weight and the pixel value of the association pixel.

In detail, the interpolation processing is realized as follows: with reference to energy changes of the image in different directions and according to weights of the association pixels in different directions, the pixel value of the simulation pixel is calculated by a linear interpolation. From the direction having a smaller energy change, it can get a higher reference value, i.e., the weight for this direction in the interpolation is high.

In some examples, for sake of convenience, only the horizontal direction and the vertical direction are considered.

The pixel value of the simulation pixel R5'5' is obtained by an interpolation based on the original pixels R44, R74, R47 and R77. Since there is no original pixel with a same color as the simulation pixel (i.e., R) in the horizontal direction and the vertical direction of the original pixel R55 corresponding the simulation pixel R5'5', a component of this color (i.e., R) in each of the horizontal direction and the vertical direction is calculated according to the association pixels. The components in the horizontal direction are R45 and R75, the components in the vertical direction are R54 and R57. All the components can be calculated according to the original pixels R44, R74, R47 and R77.

In detail, R45=R44*2/3+R47*1/3, R75=2/3*R74+1/3*R77, R54=2/3*R44+1/3*R74, R57=2/3*R47+1/3*R77.

The change of color and the weight in each of the horizontal direction and the vertical direction are calculated respectively. In other words, according to the change of color in each direction, the reference weight in each direction used in the interpolation is determined. The weight in the direction with a small change is high, while the weight in the direction with a big change is low. The change in the horizontal direction is X1=|R45−R75|. The change in the vertical direction is X2=|R54−R57|, W1=X1/(X1+X2), W2=X2/(X1+X2).

After the above calculation, the pixel value of the simulation pixel R5'5' can be calculated as R5'5'=(2/3*R45+1/3*R75)*W2+(2/3*R54+1/3*R57)*W1. It can be understood that, if X1>X2, then W1>W2. The weight in the horizontal direction is W2, and the weight in the vertical direction is W1, vice versa.

Accordingly, the pixel value of the simulation pixel can be calculated by the interpolation algorithm. After the calculations on the association pixels, the original pixels can be converted into the simulation pixels arranged in the typical Bayer array. In other words, four adjacent simulation pixels arranged in the 2-by-2 array include one red simulation pixel, two green simulation pixels and one blue simulation pixel.

It should be noted that, the interpolation processing is not limited to the above-mentioned method, in which only the pixel values of pixels with a same color as the simulation pixel in the vertical direction and the horizontal direction are considered during calculating the pixel value of the simulation pixel. In other embodiments, pixel values of pixels with other colors can also be considered.

Figure 12:
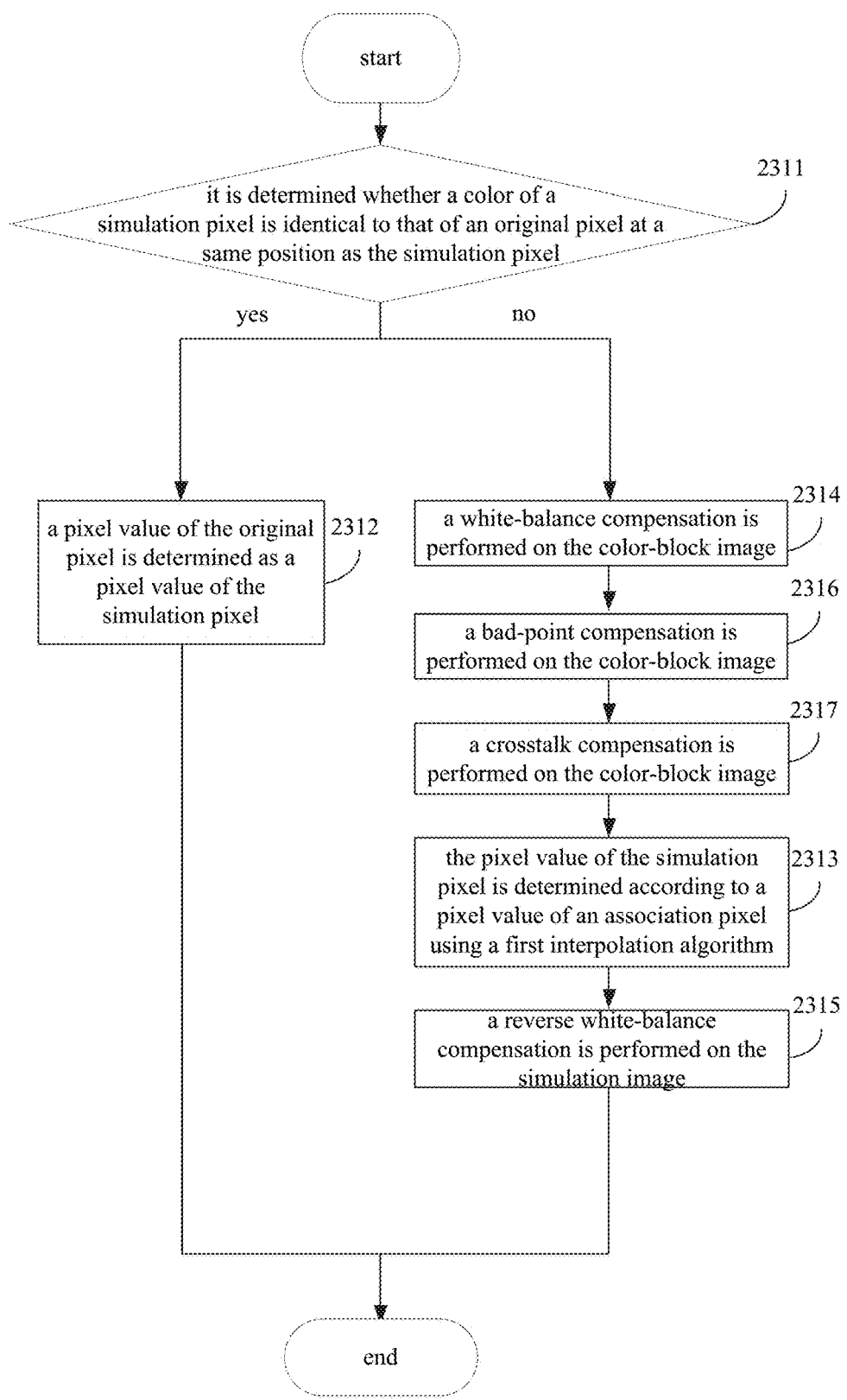
FIG. 12 is a flow chart of an image processing method according to an embodiment of the present disclosure.

Referring to FIG. 12, in some embodiments, before the act at block 2313, the method further includes performing a white-balance compensation on the color-block image, as illustrated at block 2314.

Accordingly, after the act at 2313, the method further includes performing a reverse white-balance compensation on the simulation image, as illustrated at block 2315.

In detail, in some examples, when converting the color-block image into the simulation image, during the interpolation, the red and blue simulation pixels not only refer to the color weights of original pixels having the same color as the simulation pixels, but also refer to the color weights of original pixels with the green color. Thus, it is required to perform the white-balance compensation before the interpolation to exclude an effect of the white-balance in the interpolation calculation. In order to avoid the white-balance of the color-block image, it is required to perform the reverse white-balance compensation after the interpolation according to gain values of the red, green and blue colors in the compensation.

In this way, the effect of the white-balance in the interpolation calculation can be excluded, and the simulation image obtained after the interpolation can keep the white-balance of the color-block image.

Referring to FIG. 12 again, in some implementations, before the act at block 2313, the method further includes performing a bad-point compensation on the color-block image, as illustrated at block 2316.

It can be understood that, limited by the manufacturing process, there may be bad points in the image sensor 10. The bad point presents a same color all the time without varying with the photosensibility, which affects quality of the image. In order to ensure an accuracy of the interpolation and prevent from the effect of the bad points, it is required to perform the bad-point compensation before the interpolation.

In detail, during the bad-point compensation, the original pixels are detected. When an original pixel is detected as the bad point, the bad-point compensation is performed according to pixel values of other original pixels in the image pixel unit where the original pixel is located.

In this way, the effect of the bad point on the interpolation can be avoided, thus improving the quality of the image.

Referring to FIG. 12 again, in some implementations, before the act at block 2313, the method includes performing a crosstalk compensation on the color-block image, as illustrated at block 2317.

In detail, four photosensitive pixels 122 in one photosensitive pixel unit 12a cover the filters with the same color, and the photosensitive pixels 122 have differences in photosensibility, such that fixed spectrum noise may occur in pure-color areas in the simulation true-color image outputted after converting the simulation image, and the quality of the image may be affected. Therefore, it is required to perform the crosstalk compensation.

In some implementations, compensation parameters can be set by: providing a preset luminous environment, configuring imaging parameters of the imaging apparatus, capturing multi-frame images, processing the multi-frame images to obtain crosstalk compensation parameters, and storing the crosstalk compensation parameters.

As explained above, in order to perform the crosstalk compensation, it is required to obtain the compensation parameters during the manufacturing process of the image sensor of the imaging apparatus, and to store the parameters related to the crosstalk compensation into the storage of the imaging apparatus or the electronic device provided with the imaging apparatus, such as the mobile phone or tablet computer.

The preset luminous environment, for example, may include an LED uniform plate having a color temperature of about 5000K and a brightness of about 1000 lux. The imaging parameters may include a gain value, a shutter value and a location of a lens. After setting the related parameters, the crosstalk compensation parameters can be obtained.

During the process, multiple color-block images are obtained using the preset imaging parameters in the preset luminous environment, and combined into one combination color-block image, such that the effect of noise caused by using a single color-block image as reference can be reduced.

Figure 13:
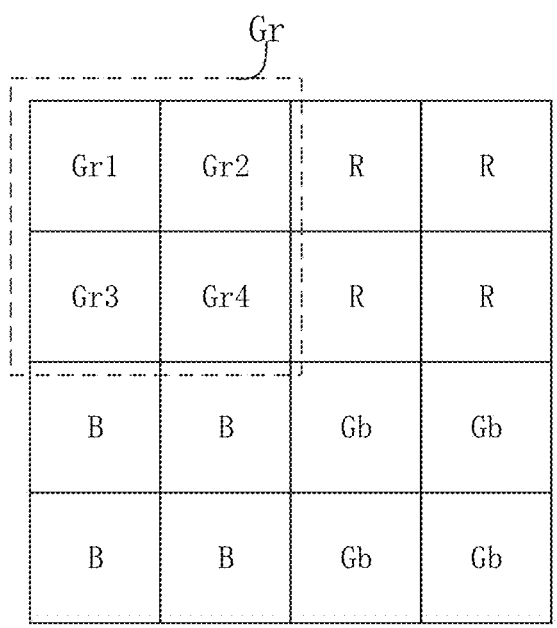
FIG. 13 is a schematic diagram showing an image pixel unit of a color-block image according to an embodiment of the present disclosure.

Referring to FIG. 13, take the image pixel unit Gr as an example. The image pixel unit Gr includes original pixels Gr1, Gr2, Gr3 and Gr4. The purpose of the crosstalk compensation is to adjust the photosensitive pixels which may have different photosensibilities to have the same photosensibility. An average pixel value of the image pixel unit is Gr_avg=(Gr1+Gr2+Gr3+Gr4)/4, which represents an average level of photosensibilities of the four photosensitive pixels. By configuring the average value as a reference value, ratios of Gr1/Gr_avg, Gr2/Gr_avg, Gr3/Gr_avg and Gr4/Gr_avg are calculated. It can be understood that, by calculating a ratio of the pixel value of each original pixel to the average pixel value of the image pixel unit, a deviation between each original pixel and the reference value can be reflected. Four ratios can be recorded in a storage of a related device as the compensation parameters, and can be retrieved during the imaging process to compensate for each original pixel, thus reducing the crosstalk and improving the quality of the image.

Generally, after setting the crosstalk compensation parameters, verification is performed on the parameters to determine the accuracy of the parameters.

During the verification, a color-block image is obtained with the same luminous environment and same imaging parameters as the preset luminous environment and the preset imaging parameters, and the crosstalk compensation is performed on the color-block image according to the calculated compensation parameters to calculate compensated Gr'_avg, Gr'1/Gr'_avg, Gr'2/Gr'_avg, Gr'3/Gr'_avg and Gr'4/Gr'_avg. The accuracy of parameters can be determined according to the calculation results from a macro perspective and a micro perspective. From the micro perspective, when a certain original pixel after the compensation still has a big deviation which is easy to be sensed by the user after the imaging process, it means that the parameters are not accurate. From the macro perspective, when there are too many original pixels with deviations after the compensation, the deviations as a whole can be sensed by the user even if a single original pixel has a small deviation, and in this case, the parameters are also not accurate. Thus, a ratio threshold can be set for the micro perspective, and another ratio threshold and a number threshold can be set for the macro perspective. In this way, the verification can be performed on the crosstalk compensation parameters to ensure the accuracy of the compensation parameters and to reduce the effect of the crosstalk on the quality of the image.

Figure 14:
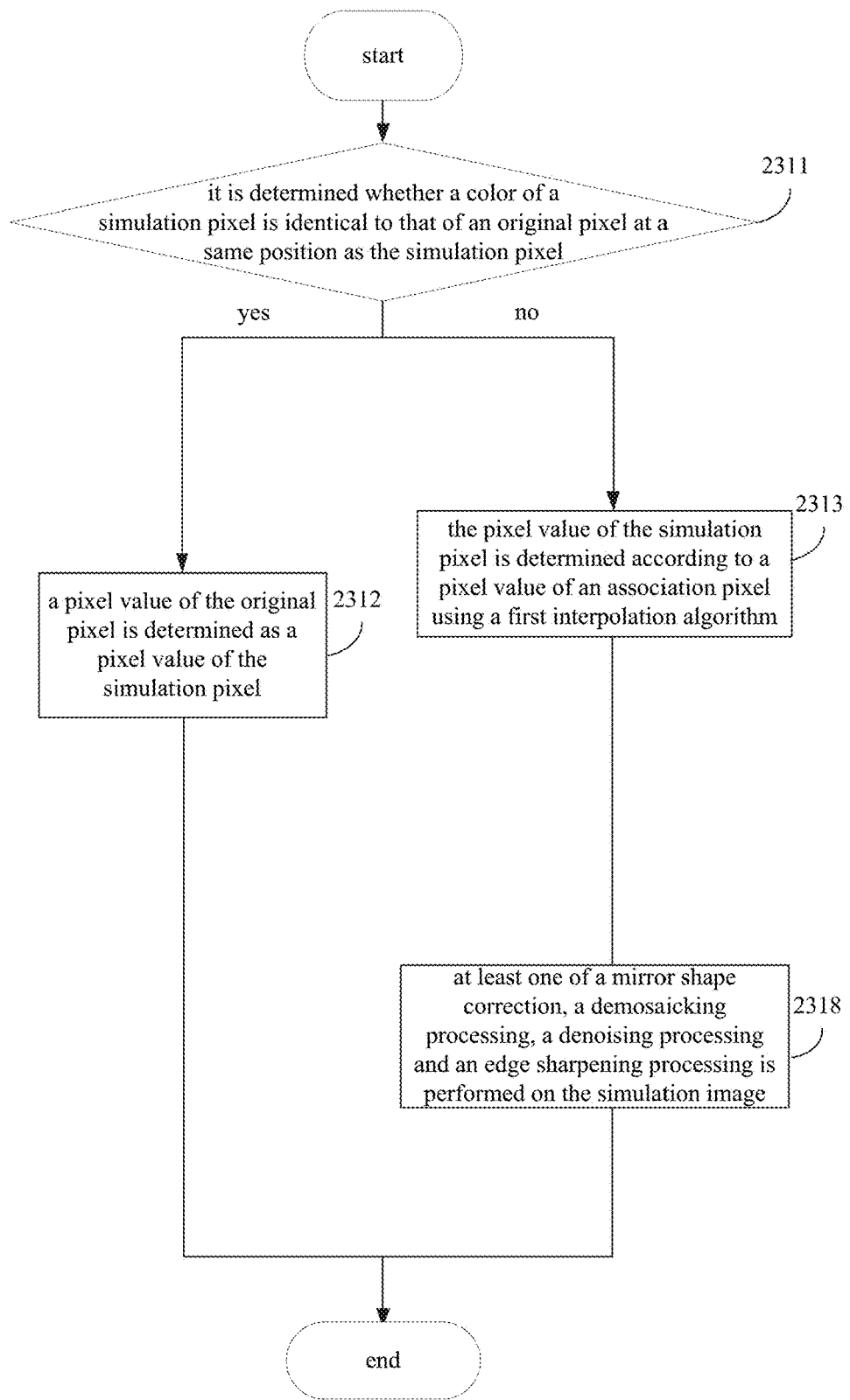
FIG. 14 is a flow chart of an image processing method according to an embodiment of the present disclosure.

Referring to FIG. 14, in some implementations, after the act at block 2313, the method further includes performing at least one of a mirror shape correction, a demosaicking processing, a denoising processing and an edge sharpening processing on the simulation image, as illustrated at block 2318.

It can be understood that, after the color-block image is converted into the simulation image, the simulation pixels are arranged in the typical Bayer array. The simulation image can be processed, during which, the mirror shape correction, the demosaicking processing, the denoising processing and the edge sharpening processing are included, such that the simulation true-color image can be obtained and output to the user.

Figure 15:
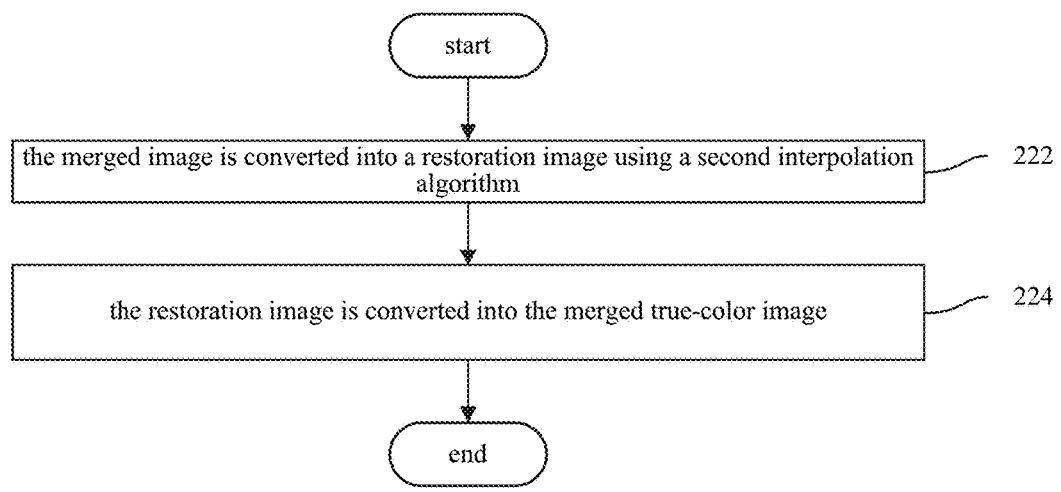
FIG. 15 is a flow chart illustrating a process of converting the merged image into a merged true-color image according to an embodiment of the present disclosure.

Referring to FIG. 15, in some implementations, the act at block 220 includes the followings.

At block 222, the merged image is converted into a restoration image using a second interpolation algorithm.

The restoration image includes restoration pixels arranged in an array, and each photosensitive pixel corresponds to one restoration pixel. A complexity of the second interpolation algorithm is less than that of the first interpolation algorithm.

At block 224, the restoration image is converted into the merged true-color image.

In some implementations, the algorithm complexity includes the time complexity and the space complexity, and both the time complexity and the space complexity of the second interpolation algorithm are less than those of the first interpolation algorithm. The time complexity is configured to measure a time consumed by the algorithm, and the space complexity is configured to measure a storage space consumed by the algorithm. If the time complexity is small, it indicates that the algorithm consumes little time. If the space complexity is small, it indicates that the algorithm consumes little storage space. Thus, it is advantageous to improve calculation speed by using the second interpolation algorithm, such that the shooting process is smooth, thus improving the user experience.

In some implementations, the second interpolation algorithm is used to quadruple the merged image without other complicated calculations, such that the restoration image corresponding to the simulation image can be obtained.

It can be understood that, after obtaining the simulation true-color image, the denoising processing and the edge sharpening processing are performed on the simulation true-color image. Thus, the simulation true-color image with high quality can be obtained after the processing and output to the user.

In another aspect, the present disclosure also provides an image processing apparatus.

Figure 16:
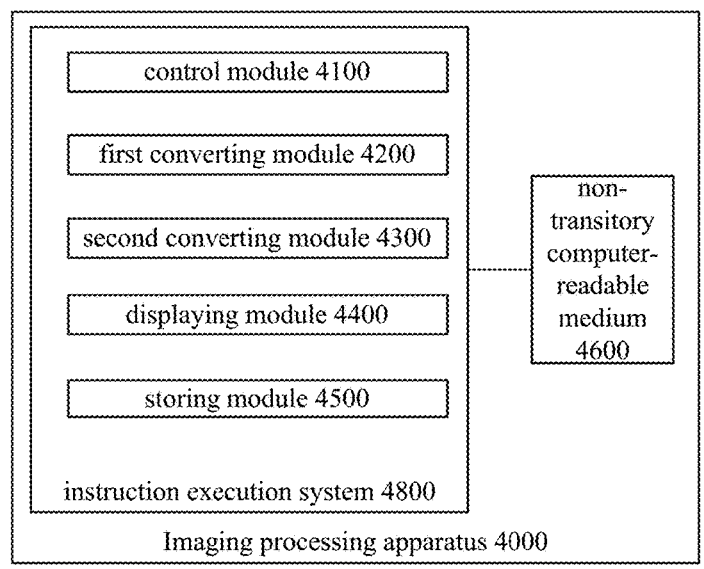
FIG. 16 is a block diagram of an image processing apparatus according to an embodiment of the present disclosure.

FIG. 16 is a block diagram of an image processing apparatus according to an embodiment of the present disclosure. Referring to FIG. 16, an image processing apparatus 4000 is illustrated. The image processing apparatus 4000 is applied in an electronic device. The electronic device includes a display and an imaging apparatus including an image sensor 10. As illustrated above, the image sensor 10 includes an array 12 of photosensitive pixel units and an array 14 of filter units arranged on the array 12 of photosensitive pixel units. Each filter unit 14a corresponds to one photosensitive pixel unit 12a, and each photosensitive pixel unit 12a includes a plurality of photosensitive pixels 122. The image processing apparatus 4000 includes a non-transitory computer-readable medium 4600 and an instruction execution system 4800. The non-transitory computer-readable medium 4600 includes computer-executable instructions stored thereon. The instruction execution system 4800 is configured by the instructions stored in the medium 4600 to implement at least one of a control module 4100, a first converting module 4200, a second converting module 4300, a displaying module 4400, and a storing module 4500.

The control module 4100 is configured to control the image sensor 10 to output a merged image and a color-block image of a same scene. The merged image includes an array of merged pixels, and the photosensitive pixels 122 in a same photosensitive pixel unit 12a are collectively output as one merged pixel. The color-block image includes image pixel units arranged in a preset array. Each image pixel unit includes a plurality of original pixels. Each photosensitive pixel unit 12a corresponds to one image pixel unit, and each photosensitive pixel 122 corresponds to one original pixel. The first converting module 4200 is configured to convert the merged image into a merged true-color image. The second converting module 4300 is configured to convert the color-block image into a simulation true-color image. The displaying module 4400 is configured to display the merged true-color image and the simulation true-color image. The storing module 4500 is configured to store at least one of the merged true-color image and the simulation true-color image according to a user input.

Figure 17:
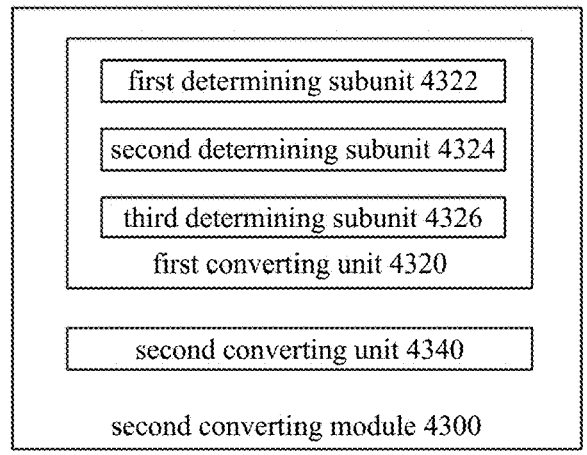
FIG. 17 is a block diagram of a second converting module according to an embodiment of the present disclosure.

Referring to FIG. 17, the second converting module 4300 includes a first converting unit 4320 and a second converting unit 4340. The first converting unit 4320 is configured to convert the color-block image into a simulation image. The simulation image includes simulation pixels arranged in the preset array, and each photosensitive pixel 122 corresponds to one simulation pixel. The second converting unit 4340 is configured to convert the simulation image into the simulation true-color image.

The first converting unit 4320 includes a first determining subunit 4322, a second determining subunit 4324, and a third determining subunit 4326. The first determining subunit 4322 is configured to determine whether a color of a simulation pixel is identical to that of an original pixel at a same position as the simulation pixel. The second determining subunit 4324 is configured to determine a pixel value of the original pixel as a pixel value of the simulation pixel when the color of the simulation pixel is identical to that of the original pixel at the same position as the simulation pixel. The third determining subunit 4326 is configured to determine the pixel value of the simulation pixel according to a pixel value of an association pixel using a first interpolation algorithm when the color of the simulation pixel is different from that of the original pixel at the same position as the simulation pixel. The association pixel is selected from an image pixel unit with a same color as the simulation pixel and adjacent to an image pixel unit including the original pixel.

In other words, the act at block 210 can be implemented by the control module 4100. The act at block 220 can be implemented by the first converting module 4200. The act at block 230 can be implemented by the second converting module 4300. The act at block 240 can be implemented by the displaying module 4400. The act at block 250 can be implemented by the storing module 4500. The act at block 231 can be implemented by the first converting unit 4320. The act at block 232 can be implemented by the second converting unit 4340. The act at block 2311 can be implemented by the first determining subunit 4322. The act at block 2312 can be implemented by the second determining subunit 4324. The act at block 2313 can be implemented by the third determining subunit 4326.

In some implementations, the third determining subunit 4326 is configured to calculate a change of the color of the simulation pixel in each direction of at least two directions according to the pixel value of the association pixel, to calculate a weight in each direction of the at least two directions according to the change, and to calculate the pixel value of the simulation pixel according to the weight and the pixel value of the association pixel. In other words, the acts at blocks 23132, 23134, and 23136 can be implemented by the third determining subunit 4326.

Figure 18:
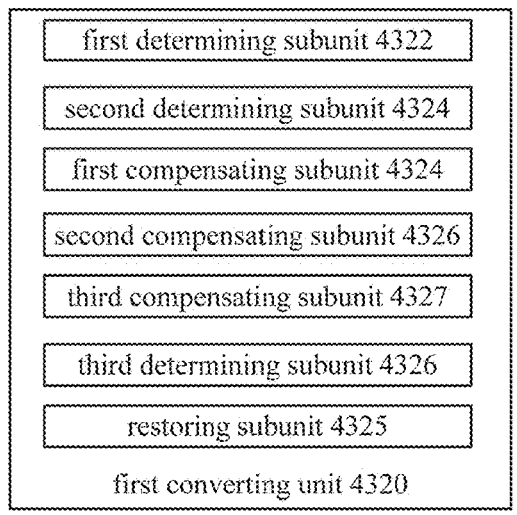
FIG. 18 is a block diagram of a first converting unit according to an embodiment of the present disclosure.

FIG. 18 is a block diagram of a first converting unit according to another embodiment of the present disclosure. Referring to FIG. 18, in some implementations, the first converting unit 4320 further includes a first compensating subunit 4324 and a restoring unit 4325. The first compensating subunit 4324 is configured to perform a white-balance compensation on the color-block image. The restoring unit 4325 is configured to perform a reverse white-balance compensation on the simulation image. In other words, the act at block 2314 can be implemented by the first compensating subunit 4324. The act at block 2315 can be implemented by the restoring unit 4325.

In some implementations, the first converting unit 4320 further includes a second compensating subunit 4326. The second compensating subunit 4326 is configured to perform a bad-point compensation on the color-block image. In other words, the act at block 2316 can be implemented by the second compensating subunit 4326.

In some implementations, the first converting unit 4320 further includes a third compensating subunit 4327. The third compensating subunit 4327 is configured to perform a crosstalk compensation on the color-block image. In other words, the act at block 2317 can be implemented by the third compensating subunit 4327.

Figure 19:
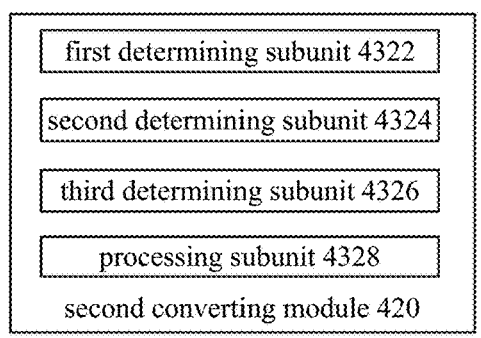
FIG. 19 is a block diagram of a first converting unit according to another embodiment of the present disclosure.

Referring to FIG. 19, in some implementations, the first converting unit 4320 further includes a processing subunit 4328. The processing subunit 4328 is configured to perform at least one of a mirror shape correction, a demosaicking processing, a denoising processing and an edge sharpening processing on the simulation image. In other words, the act at block 2318 can be implemented by the processing subunit 4328.

Figure 20:
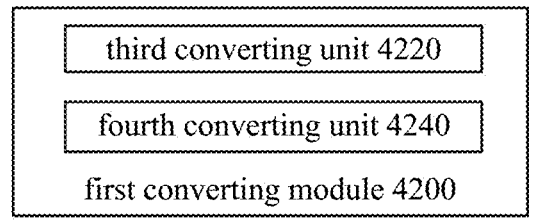
FIG. 20 is a block diagram of a first converting module according to another embodiment of the present disclosure.

FIG. 20 is a block diagram of a first converting module according to another embodiment of the present disclosure. Referring to FIG. 20, in some implementations, the first converting module 4200 includes a third converting unit 4220 and a fourth converting unit 4240. The third converting unit 4220 is configured to convert the merged image into a restoration image using a second interpolation algorithm. The restoration image includes restoration pixels arranged in an array, and each photosensitive pixel corresponds to one restoration pixel. A complexity of the second interpolation algorithm is less than that of the first interpolation algorithm. The fourth converting unit 4240 is configured to convert the restoration image into the merged true-color image. In other words, the act at block 222 can be implemented by the third converting unit 4220. The act at block 224 can be implemented by the fourth converting unit 4240.

In some implementations, the displaying module 4400 is configured to display the merged true-color image and the simulation true-color image side-by-side.

The present disclosure also provides an electronic device.

Figure 21:
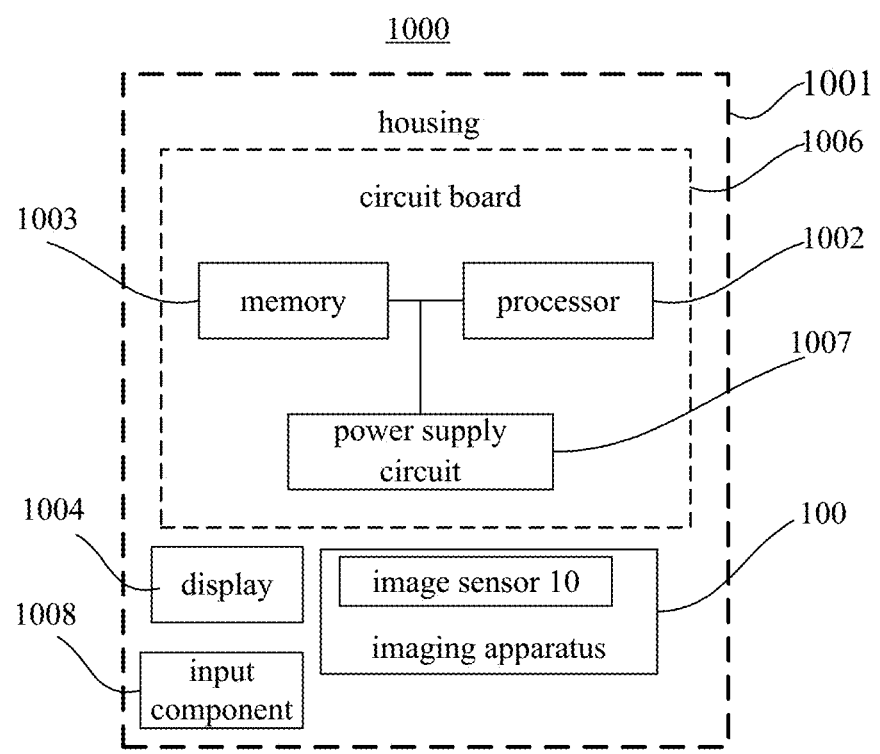
FIG. 21 is a block diagram of an electronic device according to an embodiment of the present disclosure.

FIG. 21 is a block diagram of an electronic device 1000 according to an embodiment of the present disclosure. Referring to FIG. 21, the electronic device 1000 of the present disclosure includes a housing 1001, a processor 1002, a memory 1003, a display 1004, a circuit board 1006, a power supply circuit 1007, an input component 1008 and an imaging apparatus 100. The circuit board 1006 is enclosed by the housing 1001. The processor 1002 and the memory 1003 are positioned on the circuit board 1006. The power supply circuit 1007 is configured to provide power for respective circuits or components of the electronic device 1000. The memory 1003 is configured to store executable program codes. The imaging apparatus 100 includes an image sensor 10. As illustrated above, the image sensor 10 includes an array 12 of photosensitive pixel units and an array 14 of filter units arranged on the array 12 of photosensitive pixel units. Each filter unit 14a corresponds to one photosensitive pixel unit 12a, and each photosensitive pixel unit 12a includes a plurality of photosensitive pixels 122. The display 1004 is configured to display images. The input component 1008 is configured to receive a user input.

The processor 1002 is configured to run a program corresponding to the executable program codes by reading the executable program codes stored in the memory, to perform following operations: controlling the image sensor 10 to output a merged image and a color-block image of a same scene, in which the merged image includes an array of merged pixels, and the photosensitive pixels in a same photosensitive pixel unit are collectively output as one merged pixel, the color-block image includes image pixel units arranged in a preset array, each image pixel unit includes a plurality of original pixels, each photosensitive pixel unit corresponds to one image pixel unit, and each photosensitive pixel corresponds to one original pixel; converting the merged image into a merged true-color image, and converting the color-block image into a simulation true-color image; displaying the merged true-color image and the simulation true-color image in the display; and storing at least one of the merged true-color image and the simulation true-color image according to the user input.

In some implementations, the imaging apparatus 100 includes a front camera or a real camera (not illustrated in FIG. 21).

In some implementations, the processor 1002 is configured to run a program corresponding to the executable program codes by reading the executable program codes stored in the memory, to perform converting the color-block image into a simulation true-color image by acts of: converting the color-block image into a simulation image, in which, the simulation image includes simulation pixels arranged in the preset array, and each photosensitive pixel corresponds to one simulation pixel; and converting the simulation image into the simulation true-color image. the processor 1002 is configured to run a program corresponding to the executable program codes by reading the executable program codes stored in the memory, to perform converting the color-block image into a simulation image by acts of: determining whether a color of a simulation pixel is identical to that of an original pixel at a same position as the simulation pixel; when the color of the simulation pixel is identical to that of the original pixel at the same position as the simulation pixel, determining a pixel value of the original pixel as a pixel value of the simulation pixel; and when the color of the simulation pixel is different from that of the original pixel at the same position as the simulation pixel, determining the pixel value of the simulation pixel according to a pixel value of an association pixel using a first interpolation algorithm, in which the association pixel is selected from an image pixel unit with a same color as the simulation pixel and adjacent to an image pixel unit including the original pixel.

In some implementations, the processor 1002 is configured to run a program corresponding to the executable program codes by reading the executable program codes stored in the memory, to perform determining the pixel value of the simulation pixel according to a pixel value of an association pixel by acts of: calculating a change of the color of the simulation pixel in each direction of at least two directions according to the pixel value of the association pixel; calculating a weight in each direction of the at least two directions according to the change; and calculating the pixel value of the simulation pixel according to the weight and the pixel value of the association pixel.

In some implementations, the processor 1002 is configured to run a program corresponding to the executable program codes by reading the executable program codes stored in the memory, to perform following operations: performing a white-balance compensation on the color-block image; and performing a reverse white-balance compensation on the simulation image.

In some implementations, the processor 1002 is configured to run a program corresponding to the executable program codes by reading the executable program codes stored in the memory, to perform following operation: performing at least one of a bad-point compensation and a crosstalk compensation on the color-block image.

In some implementations, the processor 1002 is configured to run a program corresponding to the executable program codes by reading the executable program codes stored in the memory, to perform following operations: performing at least one of a mirror shape correction, a demosaicking processing, a denoising processing and an edge sharpening processing on the simulation image.

In some implementations, the processor 1002 is configured to run a program corresponding to the executable program codes by reading the executable program codes stored in the memory, to perform converting the merged image into a merged true-color image by acts of: converting the merged image into a restoration image using a second interpolation algorithm, in which the restoration image includes restoration pixels arranged in an array, each photosensitive pixel corresponds to one restoration pixel, and a complexity of the second interpolation algorithm is less than that of the first interpolation algorithm; and converting the restoration image into the merged true-color image.

In some implementations, the processor 1002 is configured to run a program corresponding to the executable program codes by reading the executable program codes stored in the memory, to perform displaying the merged true-color image and the simulation true-color image by an act of displaying the merged true-color image and the simulation true-color image in parallel.

In some implementations, the electronic device may be a mobile phone or a tablet computer, which is not limited herein.

It should be understood that, the input device may further include one or more of the followings: an inputting interface, a physical button of the electronic device 1000, a microphone, etc.

It should be understood that, the electronic device 1000 may further include one or more of the following components (not illustrated in FIG. 21): an audio component, an input/output (I/O) interface, a sensor component and a communication component. The audio component is configured to output and/or input audio signals, for example, the audio component includes a microphone. The I/O interface is configured to provide an interface between the processor 1002 and peripheral interface modules. The sensor component includes one or more sensors to provide status assessments of various aspects of the electronic device 1000. The communication component is configured to facilitate communication, wired or wirelessly, between the electronic device 1000 and other devices.

It is to be understood that phraseology and terminology used herein with reference to device or element orientation (such as, terms like "center", "longitudinal", "lateral", "length", "width", "height", "up", "down", "front", "rear", "left", "right", "vertical", "horizontal", "top", "bottom", "inside", "outside", "clockwise", "anticlockwise", "axial", "radial", "circumferential") are only used to simplify description of the present invention, and do not indicate or imply that the device or element referred to must have or operated in a particular orientation. They cannot be seen as limits to the present disclosure.

Moreover, terms of "first" and "second" are only used for description and cannot be seen as indicating or implying relative importance or indicating or implying the number of the indicated technical features. Thus, the features defined with "first" and "second" may comprise or imply at least one of these features. In the description of the present disclosure, "a plurality of" means two or more than two, unless specified otherwise.

In the present disclosure, unless specified or limited otherwise, the terms "mounted," "connected," "coupled," "fixed" and the like are used broadly, and may be, for example, fixed connections, detachable connections, or integral connections; may also be mechanical or electrical connections; may also be direct connections or indirect connections via intervening structures; may also be inner communications of two elements or interactions of two elements, which can be understood by those skilled in the art according to specific situations.

In the present disclosure, unless specified or limited otherwise, a structure in which a first feature is "on" a second feature may include an embodiment in which the first feature directly contacts the second feature, and may also include an embodiment in which the first feature indirectly contacts the second feature via an intermediate medium. Moreover, a structure in which a first feature is "on", "over" or "above" a second feature may indicate that the first feature is right above the second feature or obliquely above the second feature, or just indicate that a horizontal level of the first feature is higher than the second feature. A structure in which a first feature is "below", or "under" a second feature may indicate that the first feature is right under the second feature or obliquely under the second feature, or just indicate that a horizontal level of the first feature is lower than the second feature.

Various embodiments and examples are provided in the following description to implement different structures of the present disclosure. In order to simplify the present disclosure, certain elements and settings will be described. However, these elements and settings are only examples and are not intended to limit the present disclosure. In addition, reference numerals may be repeated in different examples in the disclosure. This repeating is for the purpose of simplification and clarity and does not refer to relations between different embodiments and/or settings. Furthermore, examples of different processes and materials are provided in the present disclosure. However, it would be appreciated by those skilled in the art that other processes and/or materials may be also applied.

Reference throughout this specification to "an embodiment," "some embodiments," "an example," "a specific example," or "some examples," means that a particular feature, structure, material, or characteristic described in connection with the embodiment or example is included in at least one embodiment or example of the present disclosure. In this specification, exemplary descriptions of aforesaid terms are not necessarily referring to the same embodiment or example. Furthermore, the particular features, structures, materials, or characteristics may be combined in any suitable manner in one or more embodiments or examples. Moreover, those skilled in the art could combine different embodiments or different characteristics in embodiments or examples described in the present disclosure.

Any process or method described in a flow chart or described herein in other ways may be understood to include one or more modules, segments or portions of codes of executable instructions for achieving specific logical functions or steps in the process, and the scope of a preferred embodiment of the present disclosure includes other implementations, wherein the order of execution may differ from that which is depicted or discussed, including according to involved function, executing concurrently or with partial concurrence or in the contrary order to perform the function, which should be understood by those skilled in the art.

The logic and/or step described in other manners herein or shown in the flow chart, for example, a particular sequence table of executable instructions for realizing the logical function, may be specifically achieved in any computer readable medium to be used by the instruction execution system, device or equipment (such as the system based on computers, the system comprising processors or other systems capable of acquiring the instruction from the instruction execution system, device and equipment and executing the instruction), or to be used in combination with the instruction execution system, device and equipment. As to the specification, "the computer readable medium" may be any device adaptive for including, storing, communicating, propagating or transferring programs to be used by or in combination with the instruction execution system, device or equipment. More specific examples of the computer-readable medium comprise but are not limited to: an electronic connection (an electronic device) with one or more wires, a portable computer enclosure (a magnetic device), a random access memory (RAM), a read-only memory (ROM), an erasable programmable read-only memory (EPROM or a flash memory), an optical fiber device and a portable compact disk read-only memory (CDROM). In addition, the computer-readable medium may even be a paper or other appropriate medium capable of printing programs thereon, this is because, for example, the paper or other appropriate medium may be optically scanned and then edited, decrypted or processed with other appropriate methods when necessary to obtain the programs in an electric manner, and then the programs may be stored in the computer memories.

It should be understood that each part of the present disclosure may be realized by hardware, software, firmware or their combination. In the above embodiments, a plurality of steps or methods may be realized by the software or firmware stored in the memory and executed by the appropriate instruction execution system. For example, if it is realized by the hardware, likewise in another embodiment, the steps or methods may be realized by one or a combination of the following techniques known in the art: a discrete logic circuit having a logic gate circuit for realizing a logic function of a data signal, an application-specific integrated circuit having an appropriate combination logic gate circuit, a programmable gate array (PGA), a field programmable gate array (FPGA), etc.

Those skilled in the art shall understand that all or parts of the steps in the above exemplifying method for the present disclosure may be achieved by commanding the related hardware with programs, the programs may be stored in a computer-readable storage medium, and the programs comprise one or a combination of the steps in the method embodiments of the present disclosure when running on a computer.

In addition, each function cell of the embodiments of the present disclosure may be integrated in a processing module, or these cells may be separate physical existence, or two or more cells are integrated in a processing module. The integrated module may be realized in a form of hardware or in a form of software function modules. When the integrated module is realized in a form of software function module and is sold or used as a standalone product, the integrated module may be stored in a computer-readable storage medium.

The storage medium mentioned above may be read-only memories, magnetic disks, CD, etc.

Although embodiments of present disclosure have been shown and described above, it should be understood that above embodiments are just explanatory, and cannot be construed to limit the present disclosure, for those skilled in the art, changes, alternatives, and modifications can be made to the embodiments without departing from spirit, principles and scope of the present disclosure.

What is claimed is:

1. An image processing method, applied in an electronic device, wherein the electronic device comprises a display and an imaging apparatus comprising an image sensor, the image sensor comprises an array of photosensitive pixel units and an array of filter units arranged on the array of photosensitive pixel units, each filter unit corresponds to one photosensitive pixel unit, and each photosensitive pixel unit comprises a plurality of photosensitive pixels, the image processing method comprises:

controlling an image sensor to output a merged image and a color-block image of a same scene, wherein the merged image comprises an array of merged pixels, the photosensitive pixels in a same photosensitive pixel unit are collectively output as one merged pixel, the color-block image comprises image pixel units arranged in a preset array, each image pixel unit comprises a plurality of original pixels, each photosensitive pixel unit corresponds to one image pixel unit, and each photosensitive pixel corresponds to one original pixel;

converting the merged image into a merged true-color image, and converting the color-block image into a simulation true-color image;

displaying the merged true-color image and the simulation true-color image; and storing at least one of the merged true-color image and the simulation true-color image according to a user input.

2. The image processing method according to claim 1, wherein converting the color-block image into a simulation true-color image comprises:

converting the color-block image into a simulation image, wherein the simulation image comprises simulation pixels arranged in the preset array, and each photosensitive pixel corresponds to one simulation pixel;

converting the simulation image into the simulation true-color image, wherein, converting the color-block image into a simulation image comprises:

determining whether a color of a simulation pixel is identical to that of an original pixel at a same position as the simulation pixel;

when the color of the simulation pixel is identical to that of the original pixel at the same position as the simulation pixel, determining a pixel value of the original pixel as a pixel value of the simulation pixel; and when the color of the simulation pixel is different from that of the original pixel at the same position as the simulation pixel, determining the pixel value of the simulation pixel according to a pixel value of an association pixel using a first interpolation algorithm, wherein the association pixel is selected from an image pixel unit with a same color as the simulation pixel and adjacent to an image pixel unit comprising the original pixel.

3. The image processing method according to claim 2, wherein determining the pixel value of the simulation pixel according to a pixel value of an association pixel comprises:

calculating a change of the color of the simulation pixel in each direction of at least two directions according to the pixel value of the association pixel;

calculating a weight in each direction of the at least two directions according to the change; and calculating the pixel value of the simulation pixel according to the weight and the pixel value of the association pixel.

4. The image processing method according to claim 1, wherein the preset array comprises a Bayer array.

5. The image processing method according to claim 1, wherein the image pixel unit comprises original pixels arranged in a 2-by-2 array.

6. The image processing method according to claim 1, further comprising:

performing a white-balance compensation on the color-block image; and performing a reverse white-balance compensation on the simulation image.

7. The image processing method according to claim 1, further comprising:

performing at least one of a bad-point compensation and a crosstalk compensation on the color-block image.

8. The image processing method according to claim 1, further comprising:

performing at least one of a mirror shape correction, a demosaicking processing, a denoising processing and an edge sharpening processing on the simulation image.

9. The image processing method according to claim 2, wherein converting the merged image into a merged true-color image comprises:

converting the merged image into a restoration image using a second interpolation algorithm, wherein the restoration image comprises restoration pixels arranged in an array, each photosensitive pixel corresponds to one restoration pixel, and a complexity of the second interpolation algorithm is less than that of the first interpolation algorithm; and converting the restoration image into the merged true-color image.

10. The image processing method according to claim 1, wherein displaying the merged true-color image and the simulation true-color image comprises:

displaying the merged true-color image and the simulation true-color image side-by-side.

11. An image processing apparatus, applied in an electronic device, wherein the electronic device comprises a display and an imaging apparatus comprising an image sensor, the image sensor comprises an array of photosensitive pixel units and an array of filter units arranged on the array of photosensitive pixel units, each filter unit corresponds to one photosensitive pixel unit, and each photosensitive pixel unit comprises a plurality of photosensitive pixels; the image processing apparatus comprises a non-transitory computer-readable medium comprising computer-executable instructions stored thereon, and an instruction execution system which is configured by the instructions to implement at least one of:

a control module, configured to control the image sensor to output a merged image and a color-block image of a same scene, wherein the merged image comprises an array of merged pixels, the photosensitive pixels in a same photosensitive pixel unit are collectively output as one merged pixel, the color-block image comprises image pixel units arranged in a preset array, each image pixel unit comprises a plurality of original pixels, each photosensitive pixel unit corresponds to one image pixel unit, and each photosensitive pixel corresponds to one original pixel;

a first converting module, configured to convert the merged image into a merged true-color image;

a second converting module, configured to convert the color-block image into a simulation true-color image;

a displaying module, configured to display the merged true-color image and the simulation true-color image; and a storing module, configured to store at least one of the merged true-color image and the simulation true-color image according to a user input.

12. The image processing apparatus according to claim 11, wherein the second converting module comprises:

a first converting unit, configured to convert the color-block image into a simulation image, wherein the simulation image comprises simulation pixels arranged in the preset array, and each photosensitive pixel corresponds to one simulation pixel;

a second converting unit, configured to convert the simulation image into the simulation true-color image, wherein, the first converting unit comprises:

a first determining subunit, configured to determine whether a color of a simulation pixel is identical to that of an original pixel at a same position as the simulation pixel;

a second determining subunit, configured to determine a pixel value of the original pixel as a pixel value of the simulation pixel when the color of the simulation pixel is identical to that of the original pixel at the same position as the simulation pixel; and a third determining subunit, configured to determine the pixel value of the simulation pixel according to a pixel value of an association pixel using a first interpolation algorithm when the color of the simulation pixel is different from that of the original pixel at the same position as the simulation pixel, wherein the association pixel is selected from an image pixel unit with a same color as the simulation pixel and adjacent to an image pixel unit comprising the original pixel.

13. The image processing apparatus according to claim 12, wherein the third determining subunit is configured to:

calculate a change of the color of the simulation pixel in each direction of at least two directions according to the pixel value of the association pixel;

calculate a weight in each direction of the at least two directions according to the change; and calculate the pixel value of the simulation pixel according to the weight and the pixel value of the association pixel.

14. The image processing apparatus according to claim 11, wherein the preset array comprises a Bayer array.

15. The image processing apparatus according to claim 11, wherein the image pixel unit comprises original pixels arranged in a 2-by-2 array.

16. The image processing apparatus according to claim 12, wherein the first converting unit comprises:

a first compensating subunit, configured to perform a white-balance compensation on the color-block image; and a restoring unit, configured to perform a reverse white-balance compensation on the simulation image.

17. The image processing apparatus according to claim 12, wherein the first converting unit comprises at least one of a second compensating subunit and a third compensating subunit, the second compensating subunit is configured to perform a bad-point compensation on the color-block image; and the third compensating subunit is configured to perform a crosstalk compensation on the color-block image.

18. The image processing apparatus according to claim 12, wherein the first converting unit comprises:

a processing subunit, configured to perform at least one of a mirror shape correction, a demosaicking processing, a denoising processing and an edge sharpening processing on the simulation image.

19. The image processing apparatus according to claim 11, wherein the first converting module comprises:

a third converting unit, configured to convert the merged image into a restoration image using a second interpolation algorithm, wherein the restoration image comprises restoration pixels arranged in an array, each photosensitive pixel corresponds to one restoration pixel, and a complexity of the second interpolation algorithm is less than that of the first interpolation algorithm; and a fourth converting unit, configured to convert the restoration image into the merged true-color image.

20. The image processing apparatus according to claim 11, wherein the displaying module is configured to display the merged true-color image and the simulation true-color image side-by-side.

21. An electronic device, comprising a housing, a processor, a memory, a circuit board, a power supply circuit, an input component, a display and an imaging apparatus, wherein, the circuit board is enclosed by the housing;

the processor and the memory are positioned on the circuit board;

the power supply circuit is configured to provide power for respective circuits or components of the electronic device;

the imaging apparatus comprises an image sensor, wherein the image sensor comprises an array of photosensitive pixel units and an array of filter units arranged on the array of photosensitive pixel units, each filter unit corresponds to one photosensitive pixel unit, and each photosensitive pixel unit comprises a plurality of photosensitive pixels;

the input component is configured to receive a user input;

the display is configured to display images;

the memory is configured to store executable program codes; and the processor is configured to run a program corresponding to the executable program codes by reading the executable program codes stored in the memory, to perform following operations:

controlling an image sensor to output a merged image and a color-block image of a same scene, wherein the merged image comprises an array of merged pixels, and the photosensitive pixels in a same photosensitive pixel unit are collectively output as one merged pixel, the color-block image comprises image pixel units arranged in a preset array, each image pixel unit comprises a plurality of original pixels, each photosensitive pixel unit corresponds to one image pixel unit, and each photosensitive pixel corresponds to one original pixel;

converting the merged image into a merged true-color image, and converting the color-block image into a simulation true-color image;

displaying the merged true-color image and the simulation true-color image in the display; and storing at least one of the merged true-color image and the simulation true-color image according to the user input.

22. The electronic device according to claim 21, wherein the imaging apparatus comprises a front camera and a rear camera.

* * * * *